United States Patent [19]
Rentzepis et al.

[11] Patent Number: 5,325,324
[45] Date of Patent: Jun. 28, 1994

[54] THREE-DIMENSIONAL OPTICAL MEMORY

[75] Inventors: Peter M. Rentzepis, Irvine; Sadik Esener, La Jolla, both of Calif.

[73] Assignee: Regents of the University of California, Berkeley, Calif.

[21] Appl. No.: 586,456

[22] Filed: Sep. 21, 1990

Related U.S. Application Data

[63] Continuation-in-part of Ser. No. 342,978, Apr. 25, 1989, Pat. No. 5,268,862.

[51] Int. Cl.$^5$ ................. G11C 11/42; G11C 13/04
[52] U.S. Cl. ............................ 365/127; 365/119; 365/106; 365/121
[58] Field of Search ............ 365/124, 127, 125, 119, 365/106, 107, 120, 121, 215

[56] References Cited

U.S. PATENT DOCUMENTS

| | | | |
|---|---|---|---|
| 3,466,616 | 9/1969 | Bron et al. | 365/121 |
| 3,508,208 | 4/1970 | Duguay et al. | 340/173 |
| 3,609,707 | 9/1971 | Lewis | 365/119 |
| 3,715,734 | 2/1973 | Fajans | 365/121 |
| 4,333,165 | 6/1982 | Swainson et al. | 365/121 |
| 4,466,080 | 8/1984 | Swainson et al. | 365/121 |
| 4,471,470 | 9/1984 | Swainson et al. | 365/121 |

*Primary Examiner*—Terrell W. Fears
*Attorney, Agent, or Firm*—Fuess, Davidenas & Meadows

[57] ABSTRACT

Selected domains, normally $10^3 \times 10^3$ such domains arrayed in a plane, within a three-dimensional (3-D) volume of active medium, typically 1 cm$^3$ of spirobenzopyran containing $10^2$ such planes, are temporally and spatially simultaneously illuminated by two radiation beams, normally laser light beams in various combinations of wavelengths 532nm and 1024nm, in order, dependent upon the particular combination of illuminating light, to either write binary data to, or read binary data from, the selected domains by process of two-photon (2-P) absorption. One laser light beam is preferably directed to illuminate all domains of the selected plane in and by a one-dimensional spatial light modular (1-D SLM). The other laser light beam is first spatially encoded with binary information by 2-D SLM, and is then also directed to illuminate the domains of the selected plane. Direction of the binary-amplitude-encoded spatially-encoded light beam is preferably by focusing, preferably in and by a holographic dynamic focusing lens (HDFL). During writing the selected, simultaneously illuminated, domains change their isomeric molecular form by process of 2-P absorption. During reading the selected domains fluoresce dependent upon their individually pre-established, written, states. The domains' fluorescence is focused by the HDFL, and by other optical elements including a polarizer and polarizing beam splitter, to a $10^3 \times 10^3$ detector array. I/O bandwidth to each cm$^3$ of active medium is on the order of 1 Gbit/sec to 1 Tbit/sec.

9 Claims, 10 Drawing Sheets

| Device | Capacity | Cost Per Mbyte | Access Time | I/O Bandwidth | Volatile Storage? | Future Trends and Other Comments |
|---|---|---|---|---|---|---|
| Two-Photon 3-D Memory | $10^{11} - 10^{14}$ bits | $0.1 - $10 | 1ms - 1 $\mu$s | 1 Gbit/sec-1Tbit/sec $10^6$ Channels Parallel | No | Device at research/development stage. Expect prototype in late 90's |
| Static RAM (BiCMOS) [4] | 256 Kbit | $1,000 | 10 nsec | 100 Mbit/sec Serial | Yes | Expensive and fast memory, used in caches and supercomputers. Expect 1Mbit with same cost by 1995. |
| Dynamic RAM (CMOS) [4] | 1 Mbit | $100 | 100 ns | 10 Mbit/sec Serial | Yes | Used for main memory. Expect 64 Mbit DRAM by 1995. Beyond 64Mbit, a breakthrough in technology is needed. |
| Solid-State Disk Drive [29] | 1.28 Gbits | $300 | 200 $\mu$s | 24 Mbit/sec Serial | Yes | Solid-state disk fills the gap between main memory and disk drives. |
| 5.25" Optical Disk Drive [30] | 10 Gbits | $.25 | 20 ms | 20 Mbit/sec Serial | No | Density is expected to double every 2.5 years. Other parameters grow at slower pace. |
| 5.25" Magnetic Disk Drive [30] | 10 Gbits | $1 | 10 ms | 20 Mbit/sec Serial | No | Density is expected to double every 2.5 yrs. Other parameters grow at slower pace. |
| IBM 3390 Disk Drive [7] | 120 Gbits | $10 | 10 ms | 36 Mbit/sec Serial | No | Used in supercomputers. Trend is to replace these with an array of 5¼" drives, since they are more cost effective. |
| Digital Tape Recorder [7] | 2000 Gbits | $.0025 | Sequential | 150 Mbit/sec Serial | No | Used for off-line data storage. Does not support random access. |

FIG. 13

| Computer | Approx Price | No. of Processors | Architecture | Cycle Time/ Peak Performance | I/O Bandwidth | Potential Use of Two-Photon 3-D Memory |
|---|---|---|---|---|---|---|
| Cray Y/MP [21] | $10M | 8 | MIMD BUS | 6 nsec 2.7 Gflops (64-Bit) | 40 Gbit/sec to Secondary Storage | Access time, low cost and high density make two-photon 3-D memory useful as a secondary storage device. |
| NEC SX-X [21] | $10M | 4 | MIMD BUS | 2.9 nsec 22 Gflop (64-Bit) | 8 Gbit/sec to Secondary Storage | 3-D media is removable and thus it can be used for off-line storage. |
| Intel IPSC/2 [1] | $1M | 128 | MIMD HYPERCUBE | 100 nsec 2.6 Gflops (32-Bit) | 3 Gbit/sec to Secondary Storage | 3-D memory can reduce the cost of supercomputers. |
| NCUBE-10 [1] | $1M | 1,024 | MIMD HYPERCUBE | 100 nsec 500 Mflops (64-Bit) | 6 Gbit/sec to Secondary Storage | Two-photon 3-D can capture data from parallel sensors, for later processing by a supercomputer. |
| DAP610 Array Processor [24] | $100K | 4,096 | SIMD MESH | 100 nsec 200 Mflops (32 Bit) | 40 Gbit/sec to Main Memory | SIMD synchrony is well suited to bit plane access of 3-D memory. |
| Blitzen Array Processor [25] | Research Prototype | 16,384 | SIMD MESH | 100 nsec 450 Mflops (32 Bit) | 80 Gbit/sec to Main Memory | Ideally suited for 2-D image and signal data storage. |
| Connection Machine 2 [23] | $3M | 65,536 | SIMD HYPERCUBE | 100 nsec 20 Gflops (32 Bit) | 700 Gbit/sec to Memory 3 Gbit/sec to Secondary Storage | Potentially cost effective memory for these types of computers. |
| Hughes 3-D Computer [26] | Late 1990's | 262,144 | SIMD 3-D MESH | 100 nsec 10 Gflops (32 Bits) | 5 Gbit/sec to Secondary Storage | Fits SIMD format. Use as a secondary or primary memory. |
| UCSD POEM Computer [28] | Future 2000 | 262,144 | SIMD Reconfigurable Interconnects | 100 nsec 10 Gflops (32 Bit) | 1000 Gbit/sec to Main Memory | Compatible with POEM system. Cost-effective solution for computer weight/size power dissipation. |

FIG. 14

THREE-DIMENSIONAL OPTICAL MEMORY

REFERENCE TO RELATED PATENT APPLICATIONS

The present application is a continuation-in-part of copending application Ser. No. 342,978 filed Apr. 25, 1989 now U.S. Pat. No. 5,268,862 a THREE-DIMENSIONAL OPTICAL MEMORY to the same inventor Peter M. Rentzepis who is a co-inventor in the present application. The predecessor application is assigned to the same assignee: The Regents of the University of California.

BACKGROUND OF THE INVENTION

1. Field of the Invention

The present invention generally concerns three-dimensional optical memory apparatus and memory media, and methods of using such apparatus and media. The present invention particularly concerns (i) three-dimensional volumes of active medium selectively both alterable and interrogatable by use of at least two intersecting beams of radiation, thereby to form a radiation memory; (ii) the manner of using the intersecting radiation beams and the physical and/or intersecting radiation beams and the physical and/or chemical effects of such use; (iii) the construction of binary-stated informational memory stores, three-dimensional patterns, and/or three-dimensional displays based on these effects; (iv) the manner of selectively directing intersecting radiation beams to intersect within three-dimensional volumes for purposes of addressing selected domains within such volumes, particularly as addressable memory stores; and (v) the manner of selectively impressing information on, or extracting information from, one or more intersecting beams of radiation in order that such information may be radiatively written to, or radiatively read from, a three-dimensional memory.

2. Background of the Invention

2.1 The General Requirement for Information Storage in Memories

The need for computerized data storage and processing has been increasing, in the past decade, at a high rate. In response to this need, semiconductor-based computer technology and architecture have greatly improved. However, barriers to further reducing the size and price of semiconductors may now be inhibiting development of even higher performance computers, and the more widespread use of high performance computers.

The major determinant of the size and price of high performance computers is the memory. The data storage requirements of new high performance computers, circa 1990, are very great, typically many gigabytes ($10^{12}$ bits). New and improved, compact, low cost, very high capacity memory devices are needed. These memory devices should be able to store many, many gigabytes of information, and should randomly retrieve such information at the very fast random access speeds demanded by parallel computing.

An optical memory offers the possibility of packing binary-stated information into a storage medium at very high density, each binary bit occupying a space only about one light wavelength in diameter. When practical limitations are taken into account this leads to a total capacity of about $10^{11}$ bits for a reasonably-sized two-dimensional optical storage medium—the amount of information contained in about 3000 normal size books. A comparison of the optical memory to existing types of computer memories is contained in the following Table 1.

TABLE 1

| MEMORY TYPE | CAPACITY | ACCESS TIME | COST |
|---|---|---|---|
| TAPE | $10^{10}$ bits | 100 sec | $10^{-5}$¢/bit |
| DISK | $10^{8}$ bits | 300 msec | $5 \times 10^{-2}$¢/bit |
| DRUM | $10^{7}$–$10^{8}$ bits | 10 msec | $10^{-2}$¢/bit |
| CORE | $10^{6}$ bits | 1 μsec | 2¢/bit |
| SEMICONDUCTOR | $10^{5}$ bits | 100 nsec | 20¢/bit |
| OPTICAL | $10^{9}$–$10^{12}$ bits | 10 nsec | $10^{-3}$–$10^{-4}$¢/bit |

The present invention will be seen to be embodied in a 3-D optical memory system. Any optical memory system, 3-D or otherwise, is based on light-induced changes in the optical, chemical and/or physical properties of materials.

2.2 Optical Recording Media, and the Use Thereof in Optical Memories

At the present two general classes of optical recording media exist, namely phase recording media and amplitude recording media. Recording on the first is based on light-induced changes of the index of refraction (i.e., phase holograms). Recording on the second media is based on photo-induced changes in the absorption coefficient (i.e., hole burning).

Volume information storage is a particularly attractive concept. In a two dimensional memory the theoretical storage density (proportional to $1/\lambda^2$) is $1 \times 10^{11}$ bits/cm$^2$ for =266 nm. However in a 3-D memory the theoretical storage density is $5 \times 10^{16}$ bits/cm$^3$. Thus the advantages of 3-D data storage versus previous two dimensional information storage media become apparent.

Volume information storage has previously been implemented by holographic recording in phase recording media. Reference F. S. Chen, J. T. LaMacchia and D. B. Fraser, *Appl. Phys. Lett.*, 13, 223 (1968); T. K. Gaylord, *Optical Spectra*, 6, 25 (1972); and L. d'Auria, J. P. Huignard, C. Slezak and E. Spitz, *Appl. Opt.*, 13, 808 (1974).

The present invention will be seen to implement volume writable-readable-erasable optical storage in an amplitude recording medium. One early patent dealing with three-dimensional amplitude-recording optical storage is U.S. Ser. No. 3,508,208 for an OPTICAL ORGANIC MEMORY DEVICE to Duguay and Rentzepis, said Rentzepis being the selfsame inventor of the present invention. Duguay and Rentzepis disclose an optical memory device including a two-photon fluorescent medium which has been solidified (e.g., frozen or dispersed in a stable matrix, normally a polymer). Information is written into a selected region of the medium when a pair of picosecond pulses are made to be both (i) temporally coincident and (ii) spatially overlapping within the selected region. The temporally-coincident spatially-overlapping pulses create, by process of two-photon absorption, organic free radicals which store the information at an energy level intermediate between a fluorescent energy level and a ground state energy level. The free radicals store the desired information for but a short time, and until they recombine. The information may be read out by interrogating the medium with a second pair of coincident and overlapping picosecond pulses. In the case where the medium is frozen solid, interrogation may also be accomplished by directing a collimated infrared light beam into the selected region, thereby causing that region to liquefy and permitting its contained free radicals to undergo recombination. In each of the aforementioned cases, the interrogation beam causes the interrogated region to selectively fluoresce in accordance with the presence, or absence, or free radicals. The emitted radiation is sensed by an appropriate light detector as an indication of the informational contents of the interrogated region.

This early optical memory of Duguay and Rentzepis recognizes only that two-photon absorption should be used to produce excited states (e.g., singlet, doublet or triplet states) of an active medium over the ground state of such medium. These excited states are metastable. For example, one preferred fluorescent medium is excitable from ground to a singlet state by process of two-photon absorption occurring in about $10^{-15}$ second. The excited medium will remain in the singlet state for about $10^{-8}$ second before fluorescing and assuming a metastable triplet state. This metastable state represents information storage. Alas, this metastable state will spontaneously decay to the ground state by fluorescence after about 1 second (depending on temperature). The memory is thus unstable to hold information for periods longer than about 1 second. It should be understood that the fluorescent medium of the Duguay and Rentzepis memory is at all times the identical molecular material, and simply assumes various excited energy states in response to irradiation.

Another previous optical system for accomplishing the volume storage of information, and for other purposes, is described in the related series of U.S. patent Ser. Nos. 4,078,229; 4,288,861; 4,333,165; 4,466,080; and 4,471,470 to Swainson, et al. and assigned to Formigraphic Engine Corporation. The Swainson, et al. patents are variously concerned with three-dimensional systems and media for optically producing three-dimensional inhomogeneity patterns. The optically-produced 3-D inhomogeneity patterns may exhibit (i) controlled refractive index distributions, (ii) complex patterns and shapes, or (iii) physio-chemical inhomogeneities for storing data. The Swainson, et al. patents generally show that some sort of chemical reaction between two or more reactive components may be radiatively induced at selected cell sites of a 3-D medium in order to produce a somewhat stable, changed, state at these selected sites.

U.S. patent Ser. No. 4,471,470, in particular, describes a METHOD AND MEDIA FOR ACCESSING DATA IN THREE-DIMENSIONS. Two intersecting beams of radiation are each matched to a selected optical property or properties of the active media. In one embodiment of the method and media, called by Swainson, et al. "Class I systems," two radiation beams generate an active region in the medium by simultaneous illumination. In order to do so, two different light-reactive chemical components are typically incorporated within the medium. Both components are radiation sensitive, but to different spectral regions. The two radiation beams intersecting in a selected region each produce, in parallel, an associated chemical product. When two products are simultaneously present in a selected intersection region then these products chemically react to form a desired sensible object. The sensible object may represent a binary bit of information. One or both of the radiation-induced chemical products desirably undergoes a rapid reverse reaction upon appropriate irradiation in order to avoid interference effects, and in order to permit the three-dimensional media to be repetitively stored.

In other embodiment of the Swainson et al. method and media, called "Class II systems," one of the radiation beams must act on a component of the medium before the medium will thereafter be responsive to the other radiation beam. The class I and class II systems thusly differ by being respectively responsive to the effects of simultaneously, and sequentially, induced photoreactions.

The Swainson, et al. patents—including those patents that are not directed to information storage and that are alternatively directed to making optical elements exhibiting inhomogeneity in their refractive index, or to making physical shapes and patterns—are directed to inducing changes in a bulk media by impingent directed beams of electromagnetic radiation, typically laser light, in order that selected sites within the bulk media may undergo a chemical reaction. There are a large number of photosensitive substances that are known to undergo changes in the presence of light radiation. The changed states of these substances are, in many cases, chemically reactive. The patents of Swainson, et al. describe a great number of these photosensitive and photoreactive substances. Such substances may generally be identified from a search of the literature.

Swainson, et al. also recognize that molecular excitation from a ground state to an excited state may occur following a stepwise absorption of two photons. Swainson, et al. call this "two-photon absorption." Swainson, et al. describe that a solution of 8' ally-6' nitro-1, 3, 3-trimethylspiro(2' N-1-benzopyran-2'-2-induline) in benzene may be exposed to intersecting synchronized pulsed ruby laser beams transmitted through an UV elimination filter to form, at the region of intersection, a spot of color. The process of stepwise absorption of two photons in this solution, and in others, is recognized by Swainson, et al , only as regards its use to produce an excited state that may form (as in the example) colored products, or that may serve as an energy transfer agent.

In making all manner of excited states—including singlet, doublet, triplet, and quartet states—the patents of Swainson, et al. describe known photochemistry. Generally chemistry, and photochemistry, that is known to work in one dimension is equally applicable in three dimensions. For example, it is known that an electron may be knocked off an active substance so that it becomes an ion. For example, it is known that radiation may cause a substance to dissociate a proton, again becoming an ion. For example, it is even known how to induce spin changes and changes in parity by electromagnetic radiation. Once these changes, or others, are induced in an active medium then Swainson, et al. describe a reliance on the transportive capabilities of the liquid or gaseous support media in order to permit a chemical reaction to transpire.

The present invention will be seen to reject the Swainson et al. approach of inducing chemical reactions in a 3-D medium by creating one or more reagents by use of radiation. One reason why the present invention does so is because the same support medium, or matrix, that offers those transportive capabilities that are absolutely necessary to permit the chemical reactions to occur will also permit, at least over time, undesired migration of reagents or reaction products in three dimensions, destroying the integrity of the inhomogeneity pattern.

2.3 Spatial Light Modulators

The three-dimensional optical memory of the present invention will be seen to employ spatial light modulators.

A recent survey, circa 1990, of spatial light modulators is contained in the article *Two-Dimensional Spatial Light Modulators: A Tutorial* by John A. Neff, Ravindra A. Athale, and Sing H. Lee, appearing in Proceedings of the IEEE Vol. 78, No. 5, May 1990 at page 826. The following summary is substantially derived from that article.

Two-dimensional Spatial Light Modulators (SLMs) are devices that can modulate the properties of an optical wavefront—such as the properties of amplitude, phase, or polarization—as a function of (i) two spatial dimensions and (ii) time in response to information-bearing control signals that are either optical or electrical. SLMs usefully form a critical part of optical information processing systems by serving as input transducers as well as performing several basic processing operations on optical wavefronts.

SLMs, although once considered simply as transducers that permitted the inputting of information to an optical processor, have a broad range of applications, and are capable of performing a number of useful operations on signals in the optical domain. Some of the more important functions that have been demonstrated with SLMs are: analog multiplication and addition, signal conversion (power amplification, wavelength, serial-to-parallel, incoherent-to-incoherent, electrical-to-optical), nonlinear operations, and short-term storage.

The functional capabilities of SLMs can be exploited in a wide variety of optical computering architectures. Applications of 1-D and 2-D SLMs encompass just about every optical signal processing/computing architecture conceived.

SLMs may be classified as to type. The major classification categories result from (i) the optical modulation mechanism, (ii) the variable of the optical beam that is modulated, (iii) the addressing mode (electrical or optical), (iv) the detection mechanism (for optically-addressed SLMs), and (v) the addressing mechanism (for electrically-addressed SLMs).

The modulation of at least one property of a readout light beam is inherent in the definition of an SLM. Hence the first major category of SLMs is based on modulation mechanisms. The modulation mechanism employs an intermediate representation of information within a modulating material. An information-bearing signal, either optical or electrical, is converted into this intermediate form. The major forms of conversion mechanisms that are employed in 2-D SLMs are (a) Mechanical
(b) Magnetic
(c) Electrical
(d) Thermal.

Of these conversion mechanisms, the electrical mechanism will be seen to be preferred for use in the three-dimensional optical memory of the present invention. In the electrical conversion mechanism, the electric field interacts with the modulating material at several levels, giving rise to different effects. The interaction can take the form of distorting the crystal lattice, changing the molecular orientations, or modulating the electron density functions.

A conversion mechanism and the modulating material so converted have a characteristic response time, activation energy, and spatial scale. These parameters, in turn, have a major impact on the respective speed sensitivity and spatial resolution of the optical modulation performed by the SLM. A modulation mechanism, however, becomes physically more specific only when combined with a choice of appropriate modulation variables, to be discussed next.

An optical wavefront has several associated variables that can be modulated as a function of the spatial coordinates and time in order to carry information. These variables include (a) Intensity (amplitude)
(b) Phase
(c) Polarization
(d) Spatial frequency spectrum (texture).

Intensity (amplitude) and phase are the most commonly used representations in an optical computing system. Polarization and spatial frequency spectrum are often used as intermediate representations, and are converted into intensity or phase modulation before the information is used in the next stage of the optical computing system. Intensity (amplitude), phase, and polarization modulation will each be seen to be employed in the three-dimensional optical memory of the present invention.

Intensity, or amplitude, modulation commonly results when the absorption characteristics of a modulating material are changed. Because the intensity of a light beam is proportional to the square of its amplitude, the difference between these two modes depends on the variable that is employed in subsequent processing of a SLM output. The present invention will be seen to be more concerned with selectively controllably spatially modulating to zero intensity, and amplitude, then with any requirement that modulation at and to an opposite binary state should produce sufficient intensity, and amplitude, so as to permit a desired operation within an optical memory. This is because any presence of light intensity, or amplitude, in those spatial locations of an optical wavefront (i.e., at a particular time) where, and when, there is desirably no light intensity, nor any amplitude, constitutes optical noise.

The three-dimensional optical memory in accordance with the present invention will be seen to be innately highly insensitive to optical noise, being roughly sensitive to $(noise/signal)^2$, as opposed to the lesser figure of merit noise/signal, in certain operations. Nonetheless to this innate insensitivity, optical noise may be cumulative in degrading the integrity of informational stores within the optical memory over billions and trillions of read and write cycles. Accordingly, intensity, or amplitude, modulation in accordance with the present invention is desirably very "clean," with minimal, essentially zero, optical intensity or amplitude in those wavefront regions which are spatially modulated to one ("0") binary state. Spatial light modulation, and SLMs, will be seen to so operate in the present invention: veritably no light will be in regions where it is not wanted.

Polarization modulation is commonly achieved by modulating the birefringence associated with the modulating material of the SLM. Birefringence is a property of some materials in which the refractive index depends on the state of polarization and direction of light propagation. Depending upon the effect utilized, the state of polarization changes (e.g., from linear to elliptical), or the angle of the linear polarization changes without changing the state of polarization. The memory system of the present invention will be seen to use phase-modulating SLMs that produce each such effect.

Polarization modulation can be changed into intensity (amplitude) modulation by employing polarized readout light and an analyzer in the output. The memory system of the present invention will later be seen to be so change polarization modulation into intensity modulation. Indeed, this will be seen to be a primary approach by which the net effective intensity, or amplitude, modulation will be rendered exceptionally "clean," and of satisfactory quality to support reliable operation of the three-dimensional optical memory over great periods of time and astronomical numbers of read and write cycles.

2.4 The Figure of Merit of a Readable and Writable and Erasable Optical Memory

Most new memory technologies are typically immediately gauged by the figures of merit that have attended past technologies. These previous figures of merit, while generally representing criteria that must be met by an operational memory, are often substantially irrelevant to the truly critical performance aspects, and new figures of merit, appropriate to a new technology.

For example, the Intellectual Property Owners, Inc. gives annual awards in the name of its educational subsidiary the IPO Foundation to distinguished inventors. In the 1989 awards, Robert P. Freese, Richard N. Gardner, Leslie H. Johnson and Thomas A. Rinehart were honored for their improvements in erasable, rewritable optical disks introduced by the 3M Company during 1988. The optical disks can store 1,000 times as much information as conventional flexible diskettes used with personal computers. The inventors were the first to achieve a signal to noise ratio for an erasable optical disk in excess of 50 decibels.

Although the inventors of the present invention would be the first to recognize this contribution, and to acknowledge the necessity of an adequate optical (and electrical) signal-to-noise ratio for optical memories, a focus on signal-to-noise as a figure of merit may be rooted in the importance of this measurement in certain previous electrotechnology. For example, certain magnetic memories, such as garnet film and Block line memories, have undesirably small signal-to-noise ratios.

It is uncertain what constitutes the ultimate, or even the most appropriate, figure of merit (or figures of merit) for a readable and writable and erasable optical memory. However, it is suggested that, in the case of a three-dimensional optical memory, it is important to consider whether or not, and how fast, the memory might become "dirty" from use and suffer degradation in the integrity of its data stores.

The concept of a "dirty" three-dimensional optical memory arises because every read and write operation on the memory by use of radiation has the potential to perturb other storage domains than just those domains that are intended to be dealt with. The most analogous prior memory technology may be the original square loop ferrite magnetic core memories. In these early core memories many millions of interrogations of one memory location may cause a single magnetized core having a weak hysteresis to fail to provide a sense signal adequate for detection of its magnetic condition, meaning the binary data bit stored. Even more relevantly, unaddressed and/or unwritten cores, commonly in physically proximate positions, may sometimes inadvertently and erroneously change hysteresis state, causing attendant loss of data.

A three-dimensional optical memory is analogous. The radiation that is used to read and write selective domains of the memory can, if great care is not employed, end up, after millions or billions of cumulative cycles, changing domains other than those domains that are desired to be changed. Such an undesired change of domains degrades the integrity of the data stored within the memory.

Accordingly, the present invention concerns not only addressably reading and writing and erasing a three-dimensional optical memory and doing so at impressive levels of performance, but doing so by design, at a high figure of merit. A "high figure of merit" means that an optical memory constructed in accordance with the invention is practically and reliably useful in the real world, reliably storing and reading any and all data patterns with absolute integrity during indefinitely long periods of any pattern of use, or non-use, whatsoever. Consider that three-dimensional optical memories, storing information in a volume that is little more than a cube of plastic, are intrinsically physically amorphous and homogenous. It is prudent to use some care, and forethought, in the manner of radiative reading and writing of such a volume so that those changes that are selectively induced within selected domains of the volume should be absolutely stable and independent. Nothing should be done, or repetitively done, on any selected domains that adversely affects the integrity of non-selected domains.

SUMMARY OF THE INVENTION

The present invention contemplates (i) addressing, and (ii) writing data to or reading data from, selected domains within a three-dimensional volume of active medium by and with two selectively chosen, coincident, radiation beams. The radiation beams are selectively guided to spatial and temporal coincidence so as to cause certain selected domains, and only those certain selected domains, to selectively undergo selected changes by process of two-photon absorption.

The present invention is embodied in a system and method for addressing a three-dimensional radiation memory with two radiation beams so as to, at separate times, write binary data to, and to read binary, data from, such memory by process of two-photon absorption. The radiation beams are typically, but not necessarily, light, and are more typically laser light. Accordingly, a device incorporating such a memory was called a two-photon 3-D optical memory, or a 2-P 3-D OM.

The addressing of the volume memory within the 2-P 3-D OM preferably (but not necessarily) uses, as a part of one component (a holographic dynamic focusing lens, or HDFL), a hologram. Thus the 2-P 3-D OMD is preferably holographically addressed.

In the 2-P 3-D OM one directed beam of electromagnetic radiation is spatially encoded as an n $\times$ n wavefront array of binary bits by use of a two-dimensional spatial light modulator (2-D SLM). This spatially-encoded beam, and an additional, orthogonal, beam of electromagnetic radiation, are then selectively guided into spatial and temporal coincidence at a selected n $\times$ n planar array of domains within a three-dimensional matrix of such domains within a three-dimensional volume of active medium.

Dependent upon their combined energies, the spatially-encoded selectively-guided coincident radiation beams either write (change) or read (interrogate) the condition, and particularly the isomeric molecular form, of the selected domains by a process of two-photon absorption. Remaining, unselected, domains receive insufficient (i) intensity from either beam, or (ii) combined energy from both beams, so as to be substantially affected.

The manner by which the two beams of electromagnetic radiation are selectively directed constitutes an addressing of selected domains within the three-dimensional volume of active medium. The radiation beams are typically laser light. A first light beam is selectively directed so as to substantially illuminate only one selected plane of the volume, preferably by use of a first, one-dimensional, spatial light modulator (1-D SLM1). So directed, the first light beam more intensely radiatively illuminates all the domains within this selected plane than any domains located elsewhere, and in other unselected planes.

Meanwhile another, second, light beam, is directed orthogonally to the first beam. This second beam is preferably dynamically selectively focused so as to illuminate all the domains within the same selected plane more intensely than it illuminates any domains within other, remaining, planes. This selective focusing is preferably accomplished by a holographic dynamic focusing lens (HDFL). The HDFL includes both a second spatial light modular (SLM2) and a hologram. The HDFL works on the principle that a hologram can store many, typically 100+, phase-encoded lens functions, each of which can be individually recalled. The SLM2 selectively phase-encodes the second light beam with a particular phase function, causing it to select the corresponding phase-encoded lens function of the hologram.

The domains within the selected plane are spatially and temporally simultaneously illuminated by the two intersecting beams with sufficient intensity, and with sufficient combined energy from both beams, so as to change in condition by a process of two-photon absorption. Remaining domains that are not within the selected plane receive appreciable illumination only from the second beam. This second beam illumination is individually insufficiently energetic so as to change in the condition of these remaining domains. To such limited extent as these remaining domains do receive a scintilla of extraneous light from the first beam, such as reflected light resultant from internal reflection within the medium, then the intensity of the two beams in these remaining domains is insufficient so as to change the condition of any appreciable volume of the active medium therein.

The spatial encoding of the second light beam constitutes the basis by which binary data may be both written to, or read from, the three-dimensional volume of active medium.

For a "write" cycle an $n \times n$ grid array of silicon-photoconductor-based liquid crystal light valves, forming in aggregate a third spatial light modulator (SLM3), is conditioned, normally by electrical signals, in accordance with the binary data that is to be written. The encoded data will be written in parallel into the domains of a selected plane of the three-dimensional volume of active medium.

The encoding performed by a spatial light modulator can be in any of amplitude, phase, and/or polarization. In the preferred embodiment of the 2-P 3-D OM a second light beam having an energy that is suitable in conjunction with the first energy beam, to "write" the active medium is first linearly polarized by a first linear polarizer (P1). The linearly-polarized second light beam is deflected toward the conditioned SLM3 by a polarizing beam splitter (PBS). The SLM3 regionally spatially modulates the polarization of the second light beam in accordance with the binary data. The spatially-modulated second light beam is then reflected back through the PBS. The modulated regions of the beam, only, are permitted to pass back through the PBS, therein spatially encoding the second light beam in amplitude.

Accordingly, a combination of a linear polarizer (P1), a polarizing spatial light modulator (SCM3), and a polarizing beam splitter (PBS) is used to spatially encode $n \times n$ regions of a light beam in amplitude. The encoding is normally massively parallel, on the order of an array of $10^3 \times 10^3$ regions, in only a spatially modest area, on the order of $10^2$ cm. The net amplitude encoding is binary of high quality, with a region of the light beam that is encoded "off" typically having much, much less radiation flux than a region that is encoded "on."

The spatially-encoded second light beam is then imaged onto a selected plane by the HDFL. The HDFL serves to "focus" as well as to "select," typically focusing a light beam of an approximate 10 cm $\times$ 10 cm cross sectional area onto an approximate 1 cm $\times$ 1 cm image plane. The spatial and temporal coincidence of this second light beam and the first light beam, which is also at an energy appropriate to "write," selectively changes the condition of certain bit domains on $n \times n$ array of such bit domains within this selected plane. $N^2$ bits of binary data are thus stored in the $n^2$ domains.

During a "read" cycle the SLM3 spatially modulates all regions of the second light beam, now having an energy appropriate for "read," so that an unencoded beam is again passed back through the PBS, and to the HDFL. The HDFL focuses the second light beam, spatially modulated in all its regions, to a selected plane simultaneously that the SLM1 directs the first light beam, also at an energy appropriate to "read," to this same plane. All the bit domains of this selected plane are thereby simultaneously illuminated.

Each illuminated domain is in a one of the two stable conditions that it can assume. In one (only) of these two conditions an illuminated domain will emit light by the process of two-photon fluorescence. Because of the defocusing action of the HDFL, the light emissions from the selectively fluorescing domains are imaged back towards the PBS without unacceptable crosstalk. On the way to the PBS the fluorescent light is polarized 90° by a second polarizing filter (P2), normally an electro-optic $\lambda/2$ phase retardation plate. The polarization-rotated fluorescent light is deflected by the PBS not to the SLM3, nor to the laser source of the second light beam, but rather to an output array of light detectors (or indirectly to such detectors through another fourth, spatial light modular (SLM4)).

In a typical 2-P 3-D OM in accordance with the present invention the selective simultaneous steering, imaging, and focusing of two light beams transpires entirely within and by electronic, non-mechanical, light control devices. These light control devices are of a convenient macroscopic size, normally ten or so centimeters square, so as to clearly and reliably modulate, steer, gate, focus, detect or otherwise manipulate the laser light. The preferred manipulation particularly avoids any undue extraneous light, or light that is caused to go to, or to be received from, unselected domains of the three-dimensional volume. (Light intensity, and light loss, is not an appreciable problem. Any light attenuation in the system elements can, in any case, be accounted for by simply employing a brighter laser light and/or a longer write, or read, illumination cycle time.)

Although the light control devices including the SLMs and HDFL are macroscopically sized, the steering of the first light beam by the SLM1, and the dynamic focusing of the second light beam by the HDFL (which incorporates the SLM2), is into a relatively small volume, typically 1 cm$^3$. Within this volume 1000 × 1000 bit domains, each typically 1 μm × 1 μm in area, are arrayed in each of typically 100 bit planes.

The time to access a bit plane for reading or writing is primarily due to "settling" time of the SLMs, and is typically 1 ms - 1 μs. The "dwell" time is typically longer for writing than for reading, depending on the active medium. However, the parallelism is massive in either case: each bit plane that is entirely read or written within a respective single read or write cycle typically contains 10$^6$ bits. Accordingly, the net I/O bandwidth is high, typically on the order of 1 Gbit/sec (10$^{12}$ bits/sec) to 1 Tbit/sec (10$^{15}$ bits/sec).

The 2-P 3-D OM in accordance with the present invention thus exhibits suitable performance for use in high-speed caches for supercomputers, for massively parallel computers and for array processors, and, potentially, in future 3-D VLSI, optoelectronic, and/or optical computers. Meanwhile, the cost of both the memory medium, and the entire 2-P 3-D OM, in accordance with the present invention is typically well within the range of magnetic and optical disk memory systems. A 2-P 3-D OM and its medium are prospectively much less expensive than semiconductor memory devices such as SCRAMs and DRAMs. These devices are predominantly, circa 1990, manufactured outside the United States, and more particularly in Japan.

These and other aspects and attributes of the present invention will become increasingly clear upon reference to the following drawings and accompanying specification.

BRIEF DESCRIPTION OF THE DRAWINGS

FIG. 13 shows a Table 1 containing data on the 2-P 3-D OM and other memory devices (per 1989 data).

FIG. 14 shows a Table 2 containing data on use of a 2-P 3-D OM with parallel computers.

DETAILED DESCRIPTION OF THE INVENTION

Figure 1:
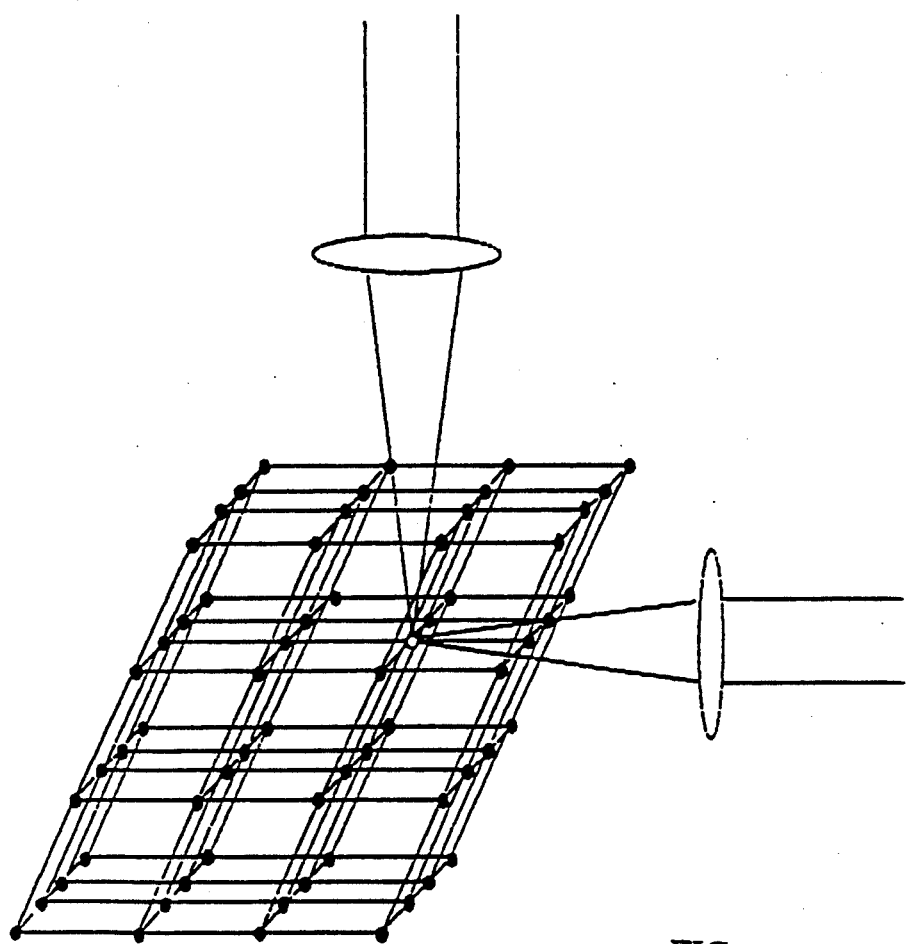
FIG. 1 is a pictorial diagram showing the principle of optically addressing data inside a volume of active medium by use of two orthogonal beams that are simultaneously incident on a region of the medium to cause a change therein by process of two-photon absorption.

The advent of optoelectronic computers and highly parallel electronic processors has brought about a need for storage systems with enormous memory capacity and memory bandwidth. These demands cannot be met with current memory technologies (i.e., with semiconductor, magnetic or optical disk technologies) without having the memory system completely dominate the computers or processors in terms of cost, power consumption, volume, and weight.

The present invention is directed to an optical volume memory store based on the two-photon (2-P) absorption effect. The volume, or three-dimensional (3-D), memory store is addressed by intersecting light beams. These light beams are controllably directed to travel through selected spatial volumes. One beam is preferably focused by, among other elements, a Dynamic Focusing Lens (DFL). The preferred DFL employs a hologram, and is thus called a Holographic Dynamic Focusing Lens (HDFL).

An optical memory incorporating both (i) the 3-D volume memory store, and (ii) the holographic addressing thereof, is thus called a two-photon three-dimensional optical memory (holographically-addressed), or 2-P 3-D OM for short. This mnemonic, as long as it is, should not be considered to set forth either the necessary, nor all the preferred, elements of an optical memory in accordance with the present invention. For example, holographic addressing (H-A) is preferred, but the mnemonic is not 2-P 3-D OM (H-A). For example, the preferred optical memory employs a spatial light modulator (SLM) for impressing data upon at least one of the light beams, but the mnemonic is not 2-P 3-D OM (SLM).

The 2-P 3-D OM accords high density, parallel access, high capacity and high I/O throughput.

1. Introduction

Sequential computers are approaching a fundamental physical limit on their computational power. Reference A. L. DeCegama, "Parallel Processing Architecture and VLSI Hardware," Prentice Hall, Inc. (1989). To achieve higher performance, computers are increasingly relying on parallel processing. Parallel processing computers require memory systems with high capacity and fast parallel access. Reference B. Robinson, "Grand Challenges to Supercomputing," Electronic Engineering Times, Sep. 18, 1989; R. H. Ewald and W. J. Worlton, "A Review of Supercomputer Installations' Mass Storage Requirements," IEEE Symposium on Mass Storage Systems, 33 (1985).

Present memory technologies such as semiconductor memories (see, for example, H. E. Maes, G. Groeseneken, H. Lebon, and J. Witters, "Trends in Semiconductor Memories," Microelectronics Journal, 20 nos. 1-2, 9-57 (1989)), optical disks (see, for example, W. P. Altman, G. M. Claffie, and M. L. Levene, "Optical Storage for High Performance Applications in the Late 1980s and Beyond," RCA Engineer (1986)), rigid and flexible magnetic disks (see, for example, A. E. Bell, "Critical Issues in High-Density Magnetic and Optical Data Storage: Part 1," Laser Focus 19, 61 (1983)), and magnetic tape each store information across a planar surface. Due to their two-dimensional nature, these storage devices are not able to provide parallel access. In addition, their access time grows with increasing capacity. The usage of memory devices based on these technologies in parallel computers can lead to an unbalanced situation where the cost, volume and power requirements of the memory device greatly exceed that of the processors. Reference K. R. Wallgren, "Optical Disks and Supercomputers," Proceedings of SPIE 529, 212 (1985).

To overcome the restrictions imposed by the present memory devices, research has been directed to identifying alternate means for information storage, including three-dimensional (3-D) optical memory devices. Reference D. Chen and J. D. Zook, "An Overview of Optical Data Storage Technology," Proceedings of the IEEE 63, 1207 (1975). 3-D optical memory devices have higher theoretical storage capacity than memory devices based on alternative technologies because information is stored in volume. For example, the maximum theoretical storage density for an optical disk is $P_{2-D} = 1/\lambda^2 = 3.5 \times 10^8$ bits/cm$^2$ assuming that 0.5 μm wavelength of light is used to access the information. On the other hand, assuming the same wavelength of light, the maximum theoretical storage density of a 3-D optical memory $P_{3-D} = 1/\lambda^3 = 6.5 \times 10^{12}$ bits/cm$^3$. In addition, 3-D optical memory devices have the potential for parallel access, because an entire bit plane can be read or written in a single memory access operation. However, the difficulty of addressing the individual memory bits without data interaction and crosstalk with other bits has previously obstructed the development of 3-D optical memory devices.

This specification disclosure describes particular optical materials, optical memory architecture, holographic addressing of an optical memory and potential applications for a bit-oriented 3-D optical memory. Various schemes have been proposed for 3-D optical memories. For example, the photorefractive effect for holographic storage (see, for example, J. E. Weaver and T. K. Gaylord, "Evaluation Experiments on Holographic Storage of Binary Data in Electro-Optic Crystals," Optical Engineering 20, 404 (1981)), spectral hole burning (see, for example, U. P. Wild, S. E. Bucher, and F. A. Burkhalter, "Hole Burning, Stark Effect, and Data Storage," Applied Optics 24, 1526 (1985)), and optical echo (see, for example, L. d'Auria, J. P. Huignard, C. Slezak, and Spitz, "Experimental Holographic Read-Write Memory Using 3-D Storage," Applied Optics 13, 808 (1974)) have each been proposed. However, the two-photon absorption effect employed in the present invention (see, for example, N. W. Carlson, L. J. Rothberg, and A. G. Yodh, "Storage and Time Reversal of Light Pulses Using Photon Echoes," Optics Letters 8, 483 (1983); Multiphoton Processes, P. Lambropoulos and S. J. Smith, Eds. (Springer-Verlag Berlin Heidelberg) (1984)), provides a means of storing data into separate selected bit locations throughout the entire volume without effecting neighboring bit locations. In addition, the two-photon absorption process has the benefits of high sensitivity, high speed, and an ability to work near room temperature. As is hereafter discussed, a 3-D optical memory device based on the two-photon absorption effect can typically achieve a very high capacity, as well as a parallel access of typically $10^6$ bits per memory read/write cycle operation. Finally, the 3-D optical memory device based on two-photon absorption has a low cost per bit because the storage material it uses is typically an inexpensive polymer.

The remainder of this specification is organized into five parts. The first part presents the physical principle behind two-photon absorption and describes the characteristics of a preferred active material that is particularly suited for a 3-D optical memory. Quantitative data is given to substantiate these characteristics. In the second part, a 2-P 3-D OM in accordance with the present invention is described, and its critical components are explained. Finally, in the third part, the 2-P 3-D OM is compared with existing memory technologies and its application in existing and future parallel supercomputers is discussed. Finally, the preferred embodiment, and theory, of the invention is recapitulated in the fourth part, and a conclusion is stated in a fifth part.

2. Principles of the Two-Photon Absorption Process

This section describes the nature of the two-photon absorption process, and a preferred effect thereof, and discusses how such process and preferred effect can be used in an optical volume memory device because of its unique support of (spatially and temporally) concurred addressing. Experimental data is presented on the "read" and "write" cycle of spirobenzopyran, a preferred active medium.

2.1 Two-Photon Absorption and its Relevance to Memory Functions

Two-photon absorption refers to the excitation of a molecule to a state of higher energy by the simultaneous absorption of two photons. The first photon excites the molecule to a virtual state, while the second photon further excites the molecule to a real excited state. Since the intermediate state is a virtual state, the two-photon process is different from a biphotonic process where a real intermediate state is present. Reference R. M. MacFarlane, Journal of Lumin. 38, 20 (1987).

The wavelength of the two concurrent beams is such that although neither of the beams is absorbed individually, the combination of the two wavelengths is in resonance with a molecular transition. Therefore both beams must overlap both temporally and spatially in order for two-photon absorption to result.

As diagrammatically shown in FIG. 1, the two beams, of equal or different wavelengths, are directed along different directions in order to select any region inside of a volume of active medium. Because the two-photon process is localized to occur at the small region of overlap between both beams, all points in the volume can be individually addressed. Depending on the wavelengths of the two beams that are incident on the material, each addressed location can be either "written" or "read" as is discussed in the next section. In addition, since the two-photon absorption is based on molecular transitions, the active medium and the memory based thereon is theoretically able to operate in the picosecond regime. Finally, the small size of the molecules and of the active medium low crosstalk between neighboring bits theoretically permits a domain size that is determined only by the optical diffraction limit of approximately 1 $\mu$m.

2.2 Material Feasibility Studies

A prototype photochromic molecule has been used to demonstrate a 3-D optical memory based on two-photon processes. Reference the predecessor related patent application of inventor P. M. Rentzepis, U.S. Ser. No. 07/342,978) (1989), the contents of which are incorporated herein by reference. The photochromic molecule, a spirobenzopyran (see, for example, R. C. Bertelson, Techniques of Chemistry: Photochromism, vol. 3, G. M. Brown, Ed. (Wiley-Interscience, New York), 45 (1971)), initially absorbs only in the ultraviolet region; upon excitation it undergoes isomeric structural changes and it subsequently absorbs in the visible region also.

Figure 2:
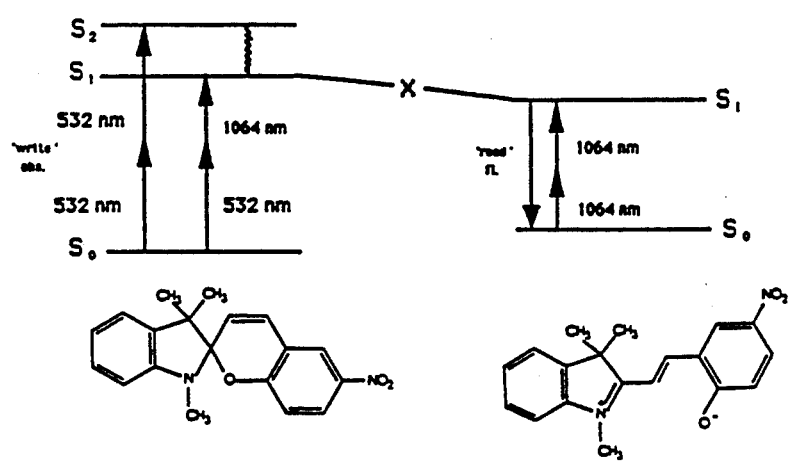
FIG. 2 is a schematic energy level diagram showing the "write" and "read" forms of a particular photochromic molecule preferred for use as the active medium in the two-photon three-dimensional optical memory (2-P 3-D OM) of the present invention: "X" is an intermediate to the isomerization of the spirobenzopyran (SP) molecules while the structures of the two forms of SP, and the preferred laser wavelengths used for writing and reading, are also shown.
Figure 3:
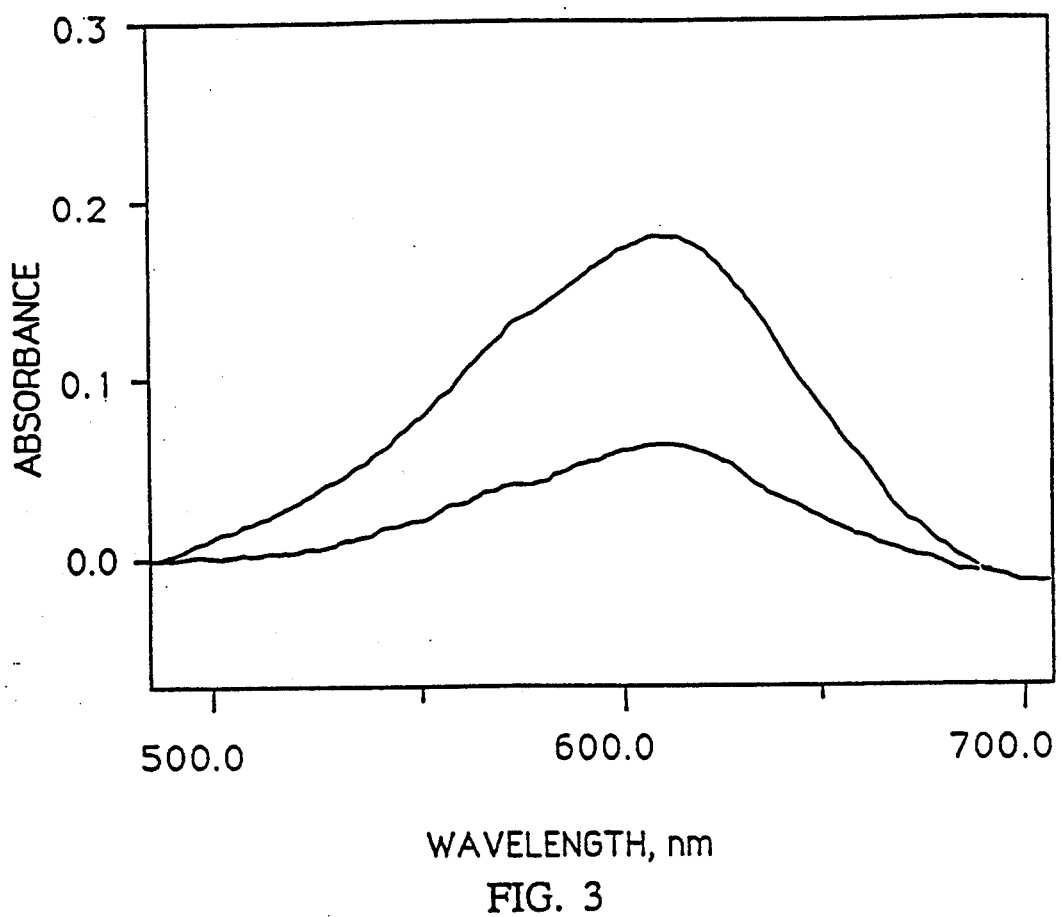
FIG. 3 is a graph showing a room temperature visible absorption spectrum of 1% SP in a PSt film, the upper curve showing absorption after irradiation for 5 sec with a 355 nm light pulse of fluence 4 mJ/cm$^2$ and the lower curve showing absorption after irradiation for 60 sec with 532 nm and 1064 nm light the total pulse fluence being 20 mJ/cm$^2$ and the beam diameter = 1 cm for both the 532 nm and 1064 nm irradiations.

A schematic energy level diagram of spirobenzopyran is shown in FIG. 2. The spirobenzopyran, embedded in a polymer matrix in the form of a 100 nm film, was irradiated simultaneously with two beams of 30 ps duration pulses having wavelengths of 532 nm and 1064 nm. Each beam had a total energy density less than 10 nJ/$\mu$m$^2$. Although spirobenzopyran does not absorb visible or near infrared energy from either beam individually, two-photon absorption resulting from the temporal and spatial coincidence of both beams resulted in a coloration of the film. The absorption spectrum of the "written," colored, spirobenzopyran molecule is shown in FIG. 3.

Figure 4:
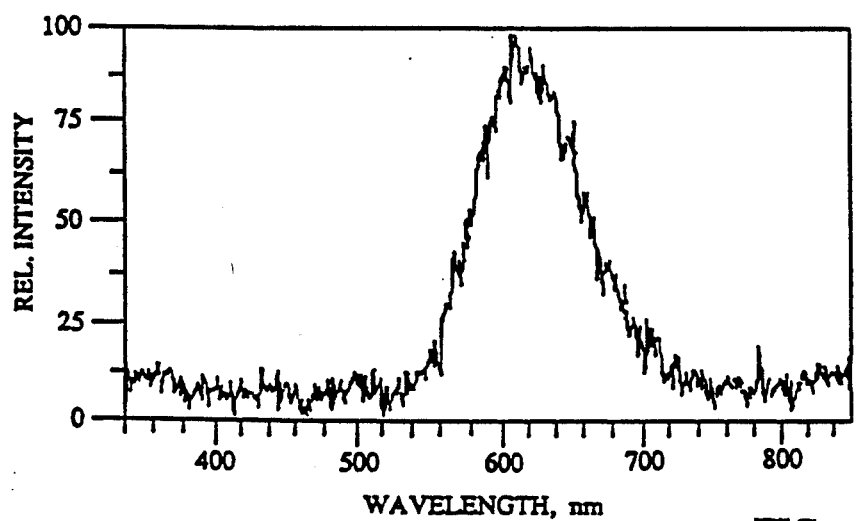
FIG. 4 is a graph showing a room temperature two-photon induced fluorescence spectra of the colored merocyanine form of 1% SP in PMMA: the excitation wavelength is 164 nm, the pulse fluence is 1.5 mJ/cm$^2$, and the beam d=2 mm.
Figure 5:
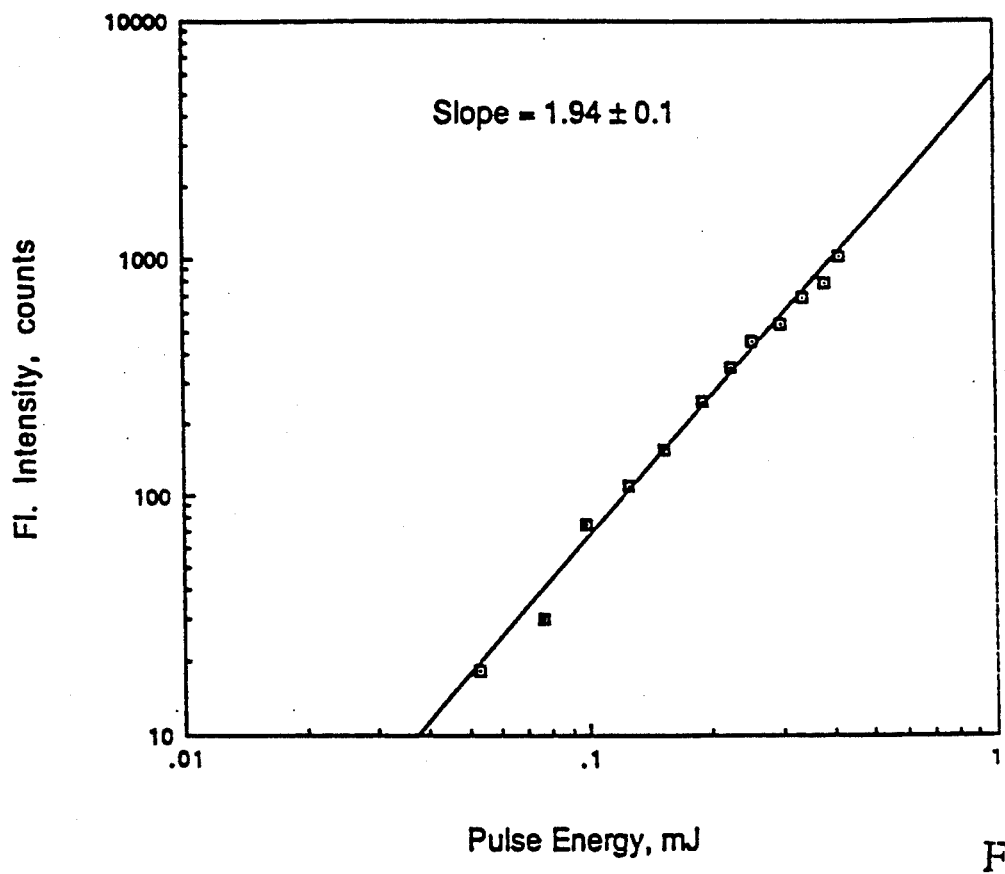
FIG. 5 is a log-log plot showing the two-photon fluorescence intensity vs. the excitation pulse energy for an active medium, and a 2-P 3-N OM, in accordance with the present invention: a slope of 2 within experimental error is observed.

The "read" process of a 2-P 3-N OM in accordance with the present invention is also based on two-photon absorption of the laser light. The "written" form of the spirobenzopyran molecule is excited with two beams each of 1064 nm wavelength laser light. A two-photon absorption of these infrared wavelength photons results in the emission of fluorescence from the "written" form of the active medium. The two-photon induced fluorescence spectrum of the "written" form of spirobenzopyran is shown in FIG. 4. The intensity of the observed fluorescence shows a square dependence on the excitation pulse energy, as shown in FIG. 5. This dependence unequivocally demonstrates the two-photon nature of the process.

Thus the "read" cycle, which can be as fast as few tens of picoseconds, is also based on a two-photon absorption process. The reading, as well as writing, is of three-dimensionally stored information. Because the "read" cycle is based on fluorescence rather than on changes in absorbance, a high sensitivity is obtained. The "written" form of the active, spirobenzopyran, medium persists at room temperature for several minutes. When the "written" form is placed in dry ice then it persists for several days. A complete discussion of the experimental results based on a spirobenzopyran molecule is presented by D. A. Parthenopoulos and P. M. Rentzepis in the article "Three dimensional optical storage memory" appearing in Science, 245, 843 (1989).

3. Two-Photon Three-Dimensional Optical Memory Device (Holographically Addressed)

Now that the behavior of the preferred memory medium has been explained, a complete description of a preferred 2-P 3-D OM is provided. The critical components in the proposed device are then discussed.

3.1 2-P 3-D OM Description

Figure 6:
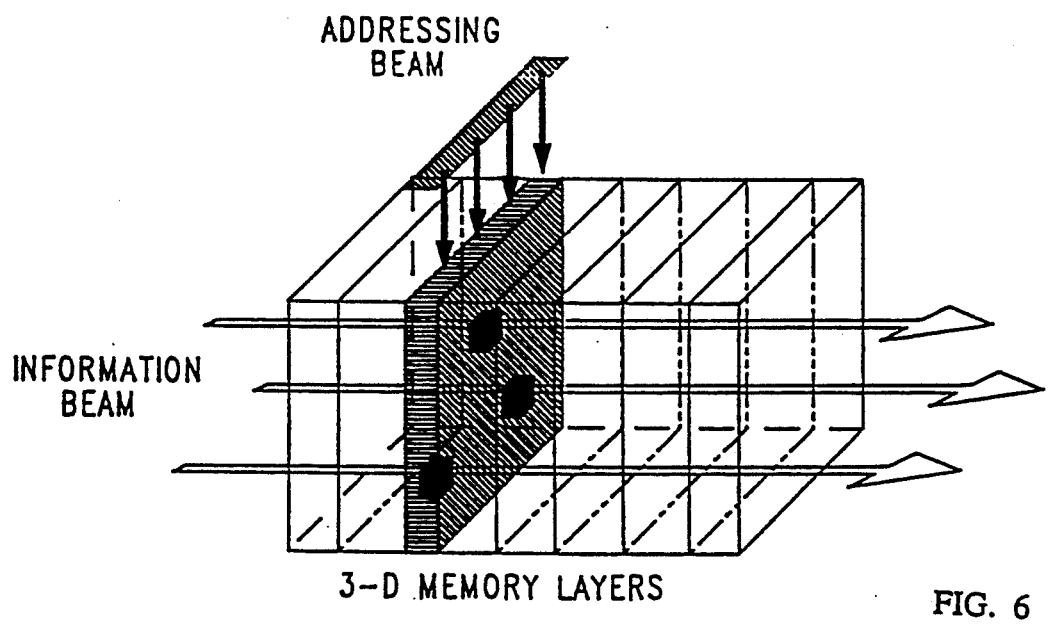
FIG. 6 is another pictorial diagram of the optical addressing of a volume of active material: the dark regions indicate the bits that are "written" by process of two-photon absorption.

The actual volume of active medium within a 2-P 3-D OM can be described as a multilayer storage, with each layer composed of a large 2-D array of bits. As is shown in FIG. 6, a desired layer of the 3-D VOLUME OF ACTIVE MEDIUM (3-D VAM) is selected and illuminated with a first addressing beam. At the same time, data is sent into the memory on a second addressing, and information, beam. Due to the two-photon nature of any changes undergone within the active medium, the data can only be stored in the selected layer, as shown by the darkened regions in FIG. 6. A very important characteristic of this addressing, and selective manipulation, of selected memory domains is the fact that a use of (i) high performance spatial light modulator (SLM) arrays, and (ii) an active medium that is optimized for small writing energies, permit an entire array of bits in a single layer to be accessed simultaneously. The optical memory thus has a parallelism of up to 10$^6$ bits in each input (write) or output (read) cycle.

Figure 7:
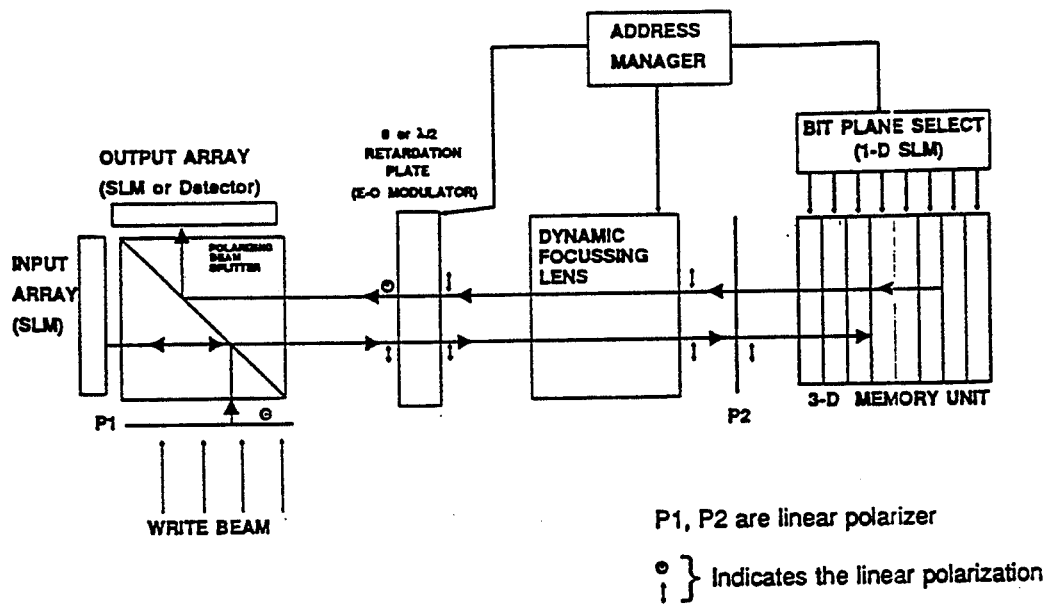
FIG. 7 is a schematic diagram showing the 2-P 3-D OM in accordance with the present invention: the memory I/O is achieved via the Input and Output SLMs while the Address Manager controls the internal components to assure proper imaging between the data arrays and the correct memory layer.

A complete 2-P 3-D OM preferred architecture is shown in FIG. 7. The 3-D VOLUME OF ACTIVE MEDIUM (3-D VAM) has been diagrammatically drawn to show the orientation of its individual layers. The connection between this 3-D VAM and a COMPUTER which is addressing the 2-P 3-D OM is via an INPUT ARRAY, an OUTPUT ARRAY and an ADDRESS MANAGER. Optical components, such as a HOLOGRAPHIC DYNAMIC FOCUSING LENS (HDFL), POLARIZERS (P1, P2), and an electro-optic RETARDATION PLATE or Electro-Optic Modulator (EOM) provide the necessary imaging between the input/output arrays and the selected layer of the 3-D VAM. The optical memory device preferably uses a Nd:Yag diode pumped solid state LASER as the light source.

Both the "write" and "read" cycles are diagrammed in FIG. 7 in order to show the flow of information both into and out of the 3-D VAM. For the "write" cycle, it is desired to take the information that is contained on the INPUT ARRAY Spatial Light Modulator or SLM3 and store it at a particular location of the 3-D VAM. In a first step of a "write" cycle the COMPUTER sends a memory address to the ADDRESS MANAGER. The ADDRESS MANAGER then communicates with the BIT PLANE SELECT 1-D Spatial Light Modulator, or SLM1 (to illuminate the correct memory plane) and also with the HOLOGRAPHIC DYNAMIC FOCUSING LENS, or HDFL (to establish a proper imaging system between the INPUT ARRAY and the memory location). Next, the host computer puts the desired bit plane information onto the INPUT ARRAY Spatial Light Modulator, or SLM3. In a final step the "write" beam enters through the POLARIZING BEAM SPLITTER, or PBS, and is deflected towards the SLM3. The SLM3 modulates the polarization of the optical field in direct correspondence with the desired information plane. Upon reflection back through the PBS, only the modulated parts are allowed to go straight through and are imaged onto the selected layer of the 3-D VAM.

For the "read" cycle, the SLM1 illuminates a particular layer of the 3-D VAM. This causes light to be generated by two-photon fluorescence at each of the written bits. This light is then polarized by a LINEAR POLARIZER, or P2, and imaged onto the OUTPUT ARRAY, or SLM4, or DETECTOR using the HDFL. In order to steer the information through the PBS and onto the OUTPUT ARRAY, the polarization must be rotated by 90°. This is achieved with the activation of the electro-optic $\lambda/2$ RETARDATION PLATE or Electro-optical Modulator, or EOM during each "read" operation. The ADDRESS MANAGER controls all of the essential components (the HOLOGRAPHIC DYNAMIC FOCUSING LENS or HDFL, the BIT PLANE SELECT or SLM1, the $\lambda/2$ RETARDATION PLATE or EOM) to guarantee that the information is imaged onto the OUTPUT ARRAY.

The optical memory system desirably has the highest possible access speed and parallelism. In the preferred 2-P 3-D OM, the speed and the parallelism are limited by the response time, size, and sensitivity of the Input and Output Arrays and the HDFL, rather than by the very high inherent speed of the active medium. Therefore, the design of these components is critical and will now be discussed.

3.2 Critical Components

The components that are used in the 2-P 3-D OM depend on the type of computing system which is accessing the device, as well as on the desired access time for the device. For access by electronic computers, the components should desirably perform all electronic-optical conversions at high speed so that the access times can be made as short as possible. A high-speed optical-electronic conversion is typically carried out at the output by use of a sensitive optical detector array. The corresponding electronic-optical conversion at the input is preferably implemented by an electronically addressed spatial light modulator, or SLM. Note that the output array must be sensitive enough to detect the fluorescence of individual bits. Also, the input array should be able to supply enough energy per pixel to write each of the bits. For future optoelectronic computers, the input and output arrays will be optically-addressed SLMs. For the preferred embodiment of the 2-P 3-D OM in accordance with the present invention, which interfaces to an electronic computer, each SLM is preferably a sensitivity-enhanced silicon-PLZT SLM (Si/PLZT) as is taught by S. H. Lee, S. Esener, M. Title, and T. Drabik in the article "Two-Dimensional Si/PLZT Spatial Light Modulator Design Considerations and Technology" appearing in Optical Engineering 25, 250 (1986). Equivalent SLMs, such as those available from Hughes Aircraft Company, may alternatively be used.

The HDFL is also an important component in the 2-P 3-D OM since it provides the interface between the SLMs and the 3-D VAM. Although dynamic focusing lens systems have been in use for many years in microscopes and zoom lenses, the high focusing speed and focusing accuracy required in the 2-P 3-D OM of the present invention precludes the use of mechanical focusing. In addition to a microsecond focusing speed, the HDFL must be able to reliably and clearly image a typically 1 $\mu$m $\times$ 1 $\mu$m spot within an array of such spots at any of typically 100 memory bit planes. In order to meet these requirements, an electro-optic dynamic focusing lens is combined with a hologram in order to create a holographic dynamic focusing lens (HDFL).

The HDFL works on the idea that a hologram can be used to store several lens functions, each of which can be individually recalled. Initially, a multiplexed hologram is recorded using the method of random phase encoding taught by E. L. Kral, J. F. Walkup, and M. O. Hagler in their article "Correlation Properties of Random Phase Diffusers for Multiplex Holography" appearing in Applied Optics 21, 1281 (1982). Random phase encoding was chosen for use in the device of the present invention because the code can be completely generated on a phase-only SLM, a highly accurate and effective type of SLM. Therefore, the selection of the correct hologram is limited only by the speed of this device.

Figure 8:
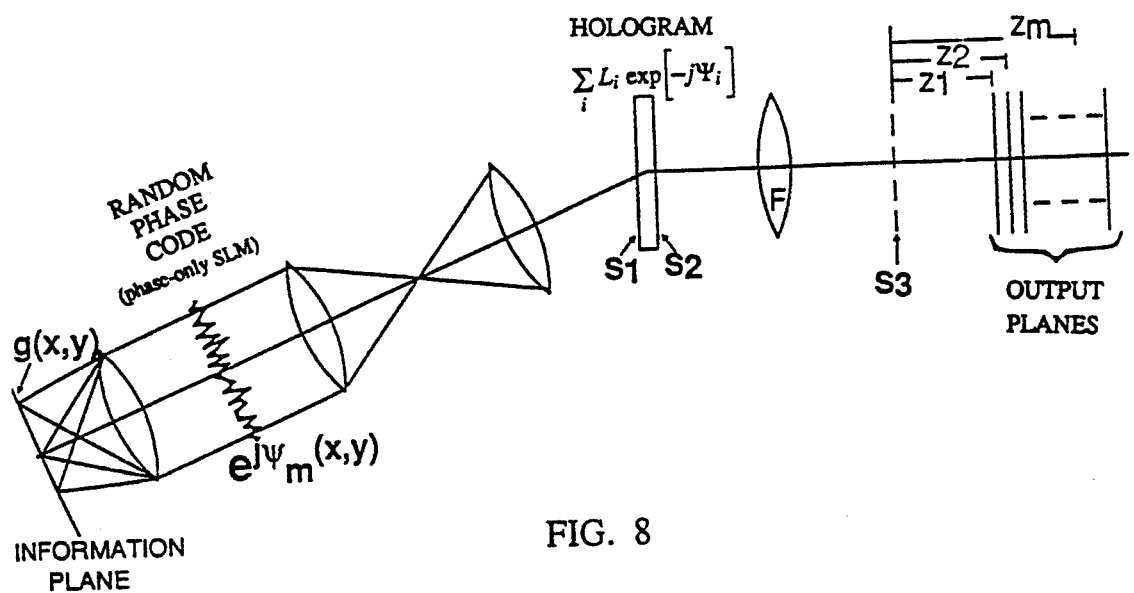
FIG. 8 is a schematic diagram showing a preferred design for the Holographic Dynamic Focusing Lens (HDFL), which provides imaging between the information plane and any one of the desired output planes: a hologram is first made using random phase codes to achieve a multiplexed hologram of all the desired lens functions and an individual lens function is thereafter selected by presenting the correct phase code on a phase-only SLM.

The HDFL component is shown in FIG. 8. The hologram is placed at the plane S3 and contains each lens function ($L_i$) and its associated random phase pattern ($\exp[j\psi_i]$). The information is placed at S1 and picks up the phase code $\exp[j\psi_m]$ at S2. This phase code allows for the selection of the lens function $L_m$ which will focus to the outer plane located at $Z_m$. Therefore, this system creates an imaging system between S1 and any of the output planes by placing the phase code of the desired lens function onto a phase-only SLM. Moreover, the reciprocal nature of this linear optical system, allows the same HDFL to be used for the input and output to the memory unit.

One attractive feature is that any focal length lens can theoretically be produced. Unfortunately,, the total number of superimposed images will be limited due to the increase in the noise with each additional stored lens function. In order to achieve an even larger number of memory bit planes, a variant of the design of the HDFL is based on a combination of an electro-optic DFL such as, preferably, the liquid crystal lens taught by S. T. Kowel, D. S. Cleverly, and P. G. Kornreich in their article "Focusing by Electrical Modulation of Refraction in a Liquid Crystal Cell" appearing in Applied Optics 23, 278 (1984), and the HDFL shown in FIG. 8. In such a variant embodiment DFL/HDFL, the HDFL focuses to several positions throughout the length of the memory, while the electro-optic DFL provides more precise focusing capabilities. This arrangement is advantageous because the complementary characteristics of the HDFL and the electro-optic DFL can be combined to achieve superior results. Accordingly, diverse embodiments and combinations of DFL and HDFL are within the scope of the present invention.

The throughput of the 2-P 3-D OM is therefore governed by (i) the SLMs used for the Input and Output Arrays, (ii) the DFL, (iii) the energy requirements of the two-photon active medium, and (iv) the optical light source (laser) technologies that are available. Using advanced SLM technologies, a HDFL component as described above, and a spirobenzopyran active medium that is optimized for two-photon storage, the 2-P 3-D OM can have an I/O bandwidth as large as 0.25 Tbit/second, assuming 512×512 SLMs operating at a frame rate of 1 MHz.

An important fact is that these same technological limitations apply to the performance of future optoelectronic computers because such computers will rely on similar SLM technologies. It is therefore believed that holographically addressed memory devices in accordance with the present invention will remain compatible with optoelectronic processing for many years to come, since the technologies of both are expected to progress at approximately the same rate.

4. Comparison and Application of the Holographically-Addressed 2-P 3-D OM

This section compares the performance of the 2-P 3-D OM with the performance of existing memory devices, and describes potential applications of 3-D optical memory in parallel computers. The proposed 2-P 3-D OM can be effectively used in present parallel computers. Its current performance (or better) will likely be required for the success of future optoelectronic and 3-D VLSI parallel computers.

4.1 Comparison of The 2-P 3-D OM With Present Memory Technologies

Figure 9:
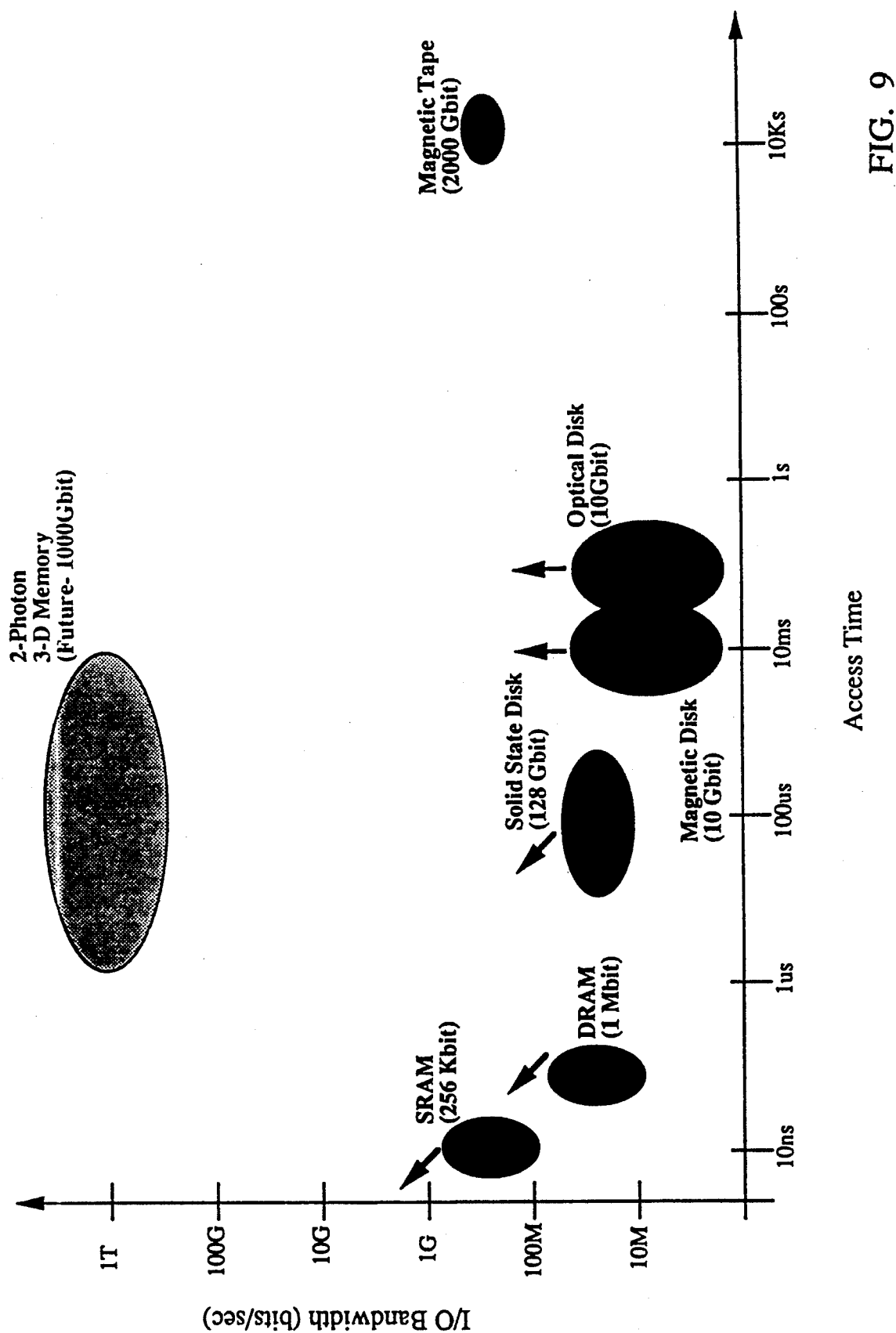
FIG. 9 is a graph showing the comparison of the 2-P 3-D OM in accordance with the present invention to other memory devices on the basis of access time and data transfer rate (bandwidth): the 2-P 3-D OM provides a much higher bandwidth than alternative memory technologies due to massively parallel access.
Figure 10:
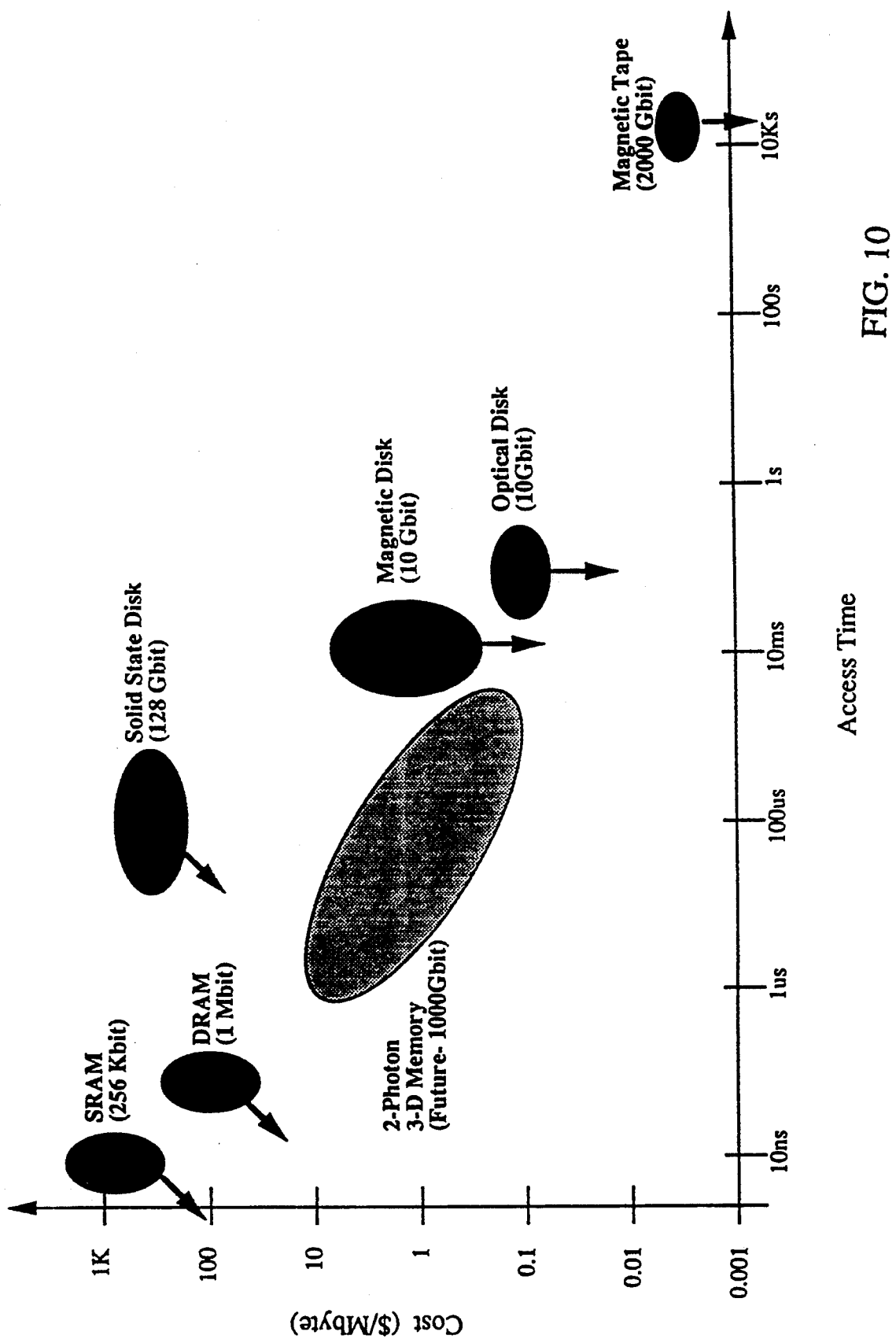
FIG. 10 is a graph showing the comparison of the 2-P 3-D OM to other memory devices on the basis of access time and cost per megabyte: the 2-P 3-D OM can potentially compete with magnetic and optical disk storage by providing faster access, higher density, and a lower, or equivalent, cost per megabyte of data stored.

The performance of the 2-P 3-D OM of the present invention is compared with present memory devices in Table 1 shown in FIG. 13. The 2-P 3-D OM is believed to provide the highest storage density and the largest parallelism (bandwidth) of any existing memory device. As shown in FIG. 9, existing memory devices are projected to increase in their storage capacity, but their bandwidth is expected to grow at a very slow rate. Thus the parallel access capability of the 2-P 3-D OM will not likely be replicated by any existing memory device. As shown in FIG. 10, the correct access time of the 2-P 3-D OM is intermediary between the access times of semiconductor memory and magnetic disk devices. Therefore, with a low cost per megabyte, 2-P 3-D OM can potentially become a more cost-effective mass storage technology than either magnetic or optical disks.

4.2 Potential Applications of the 2-P 3-D OM

Figure 11:
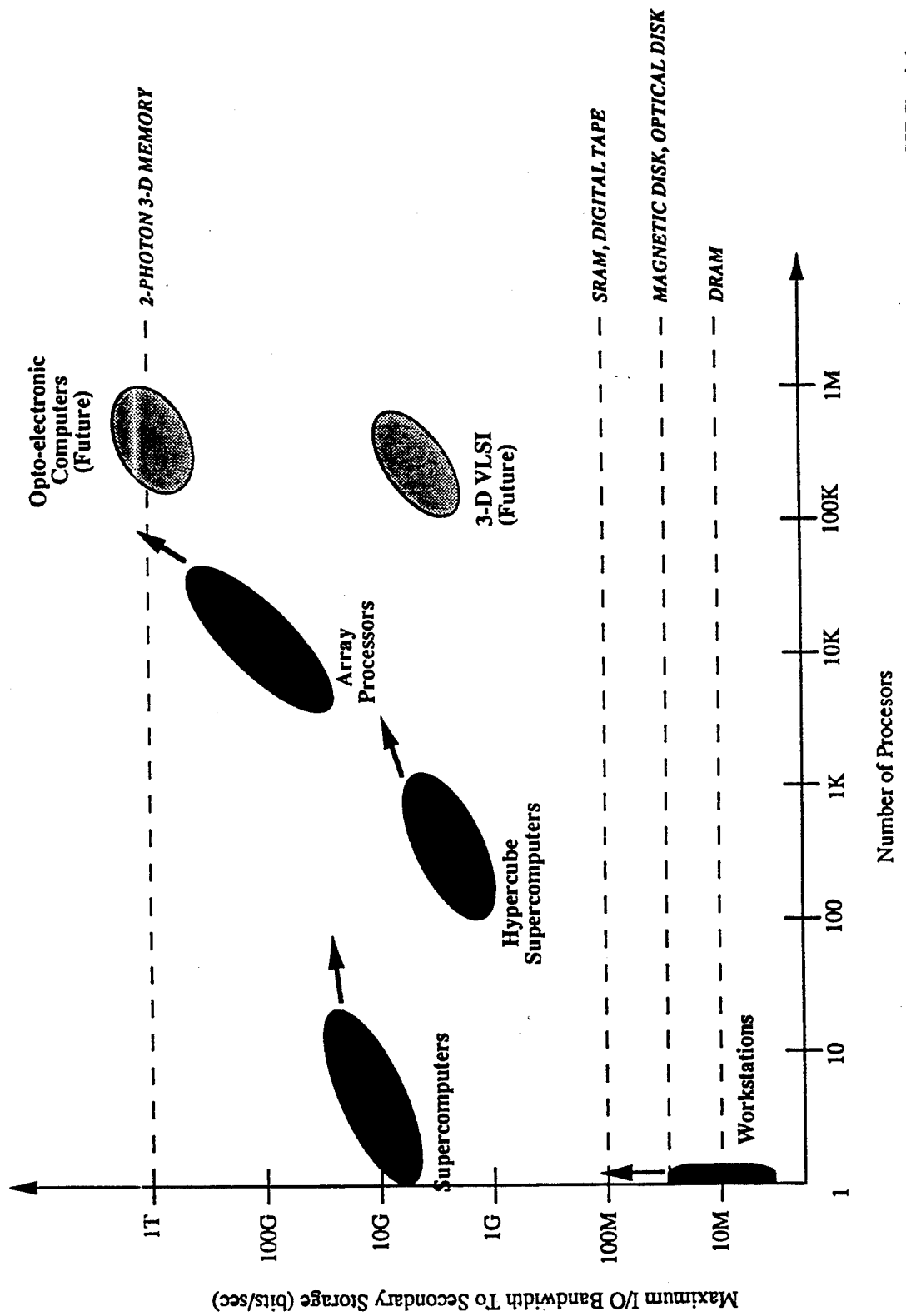
FIG. 11 is a graph showing the maximum I/O bandwidth to secondary storage for typical parallel computers wherein horizontal dashed lines indicate the bandwidth provided by various memory technologies: the bandwidth of the 2-P 3-D OM in accordance with the present invention far exceeds the data transfer rate of existing memory devices.
Figure 12:
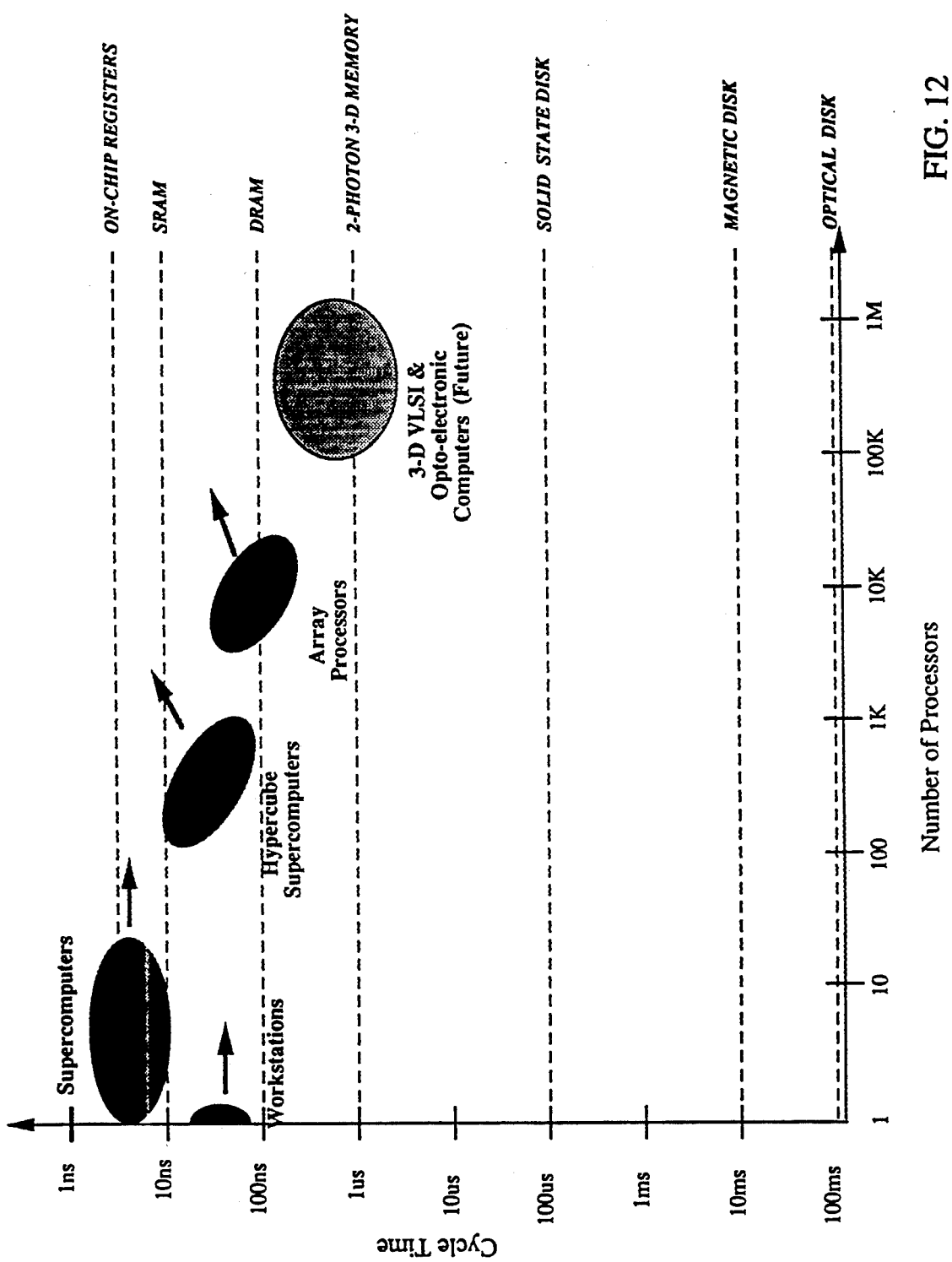
FIG. 12 is a graph showing the clock cycle time for typical parallel computers wherein dashed lines indicate the access time for the 2-P 3-D OM and other memory devices: for future optoelectronic parallel computers based on the POEM architecture, the 2-P 3-D OM can serve as the main memory storage.

The potential uses of the 2-P 3-D OM in existing and future parallel computers are described in Table 2 shown in FIG. 14. The data from table 2 is graphically presented in FIGS. 11 and 12. FIG. 11 shows that the bandwidth of the 2-P 3-D OM either exceeds or meets the bandwidth requirements of other, existing, and future parallel computers. On the other hand, the data transfer rate of existing memory devices is far below the required bandwidth, thus requiring the use of many of these devices in parallel to achieve higher bandwidth. FIG. 12 shows the typical cycle times of parallel computers vs. the number of processing elements. In existing supercomputers and hypercube parallel supercomputers (see, for example, IEEE Scientific Supercomputer Subcommittee, "Special Report on Supercomputing," Computer 22 no. 11, 57–68 (1989)), the 2-P 3-D OM can be used as a cost-effective replacement for magnetic and optical disks as a secondary storage system. In addition, the potential removability of volume memory media makes it well suited for off-line storage. Applications are envisioned where the parallel access capability of the memory is used to gather data from 2-D image sensors, and is subsequently loaded into a supercomputer for processing at a slower rate.

In SIMD array processors (see, for example, L. W. Tucker and G. G. Robertson, "Architecture and Applications of the Connection Machine," Computer, Vol. 21 No. 8, 26-38 (1988); C. G. Winckless, "Massively Parallel Computer for Signal and Image Processing," Proceedings for the 1989 IEEE International Symposium on Circuits and Systems, portland, Oreg., pp. 1396–1399 (May 8–11, 1989); R. A. Heaton and D. W. Blevins, "BLITZEN: A VLSI Array Processing Chip," Proceedings for the 1989 IEEE Custom Integrated Circuits Conference Proceedings, San Diego, Calif. (1989), pp. 12.1.1–12.1.5) the 2-P 3-D OM can potentially be used as the main memory. Since these computers operate on bit planes of information synchronously, their memory access pattern fits the access pattern for the 2-P 3-D OM. Also, since array processors use inexpensive VLSI processing elements, the potential low cost per megabyte of the 2-P 3-D OM makes it very attractive for usage in these computers.

In the future, there will likely be massively parallel computers based on 3-D VLSI (see, for example, M. J. Little and J. Grinberg, "The Third Dimension," Byte, Vol. 13, No. 11, pp. 311–319 (November 1988); Yiochi Akasaka, "Three-dimensional Integrated Circuit: Technology and Application Prospect," Microelectronics Journal, 20 nos. 1–2, 105–112 (1989)) or optoelectronics technologies (see, for example, F. Kiamilev, S. Esener, R. Paturi, Y. Fainman, P. Mercier, C. C. Guest, and S. H. Lee, "Programmable Optoelectronic multiprocessors and Their Comparison with Symbolic Substitution for Digital Optical Computing," Optical Engineering 28, 296 (1989)). For these systems, the 2-P 3-D OM or similar device may well become a necessary component because of its large degree of parallelism and high storage capacity. Using wafer-scale integration and three-dimensional packaging, these computers promise to deliver unprecedented computing power with very small cost, size and power consumption. However, using present storage technologies for secondary memory in these computers is not practical due to the overall cost, weight, power, and size of the required memory system. Fortunately, the 2-P 3-D OM is well-suited to this type of system, and will be able to efficiently satisfy the bandwidth and capacity requirements of these future computing systems.

5. Recapitulation of the Preferred Embodiment of the Invention, and Possible Variations Thereof The present invention contemplates (i) addressing, and (ii) writing data to or reading data from, selected domains within a three-dimensional volume of active medium by and with two selectively chosen, coincident, radiation beams. The radiation beams are selectively guided to spatial and temporal coincidence so as to cause certain selected domains, and only those certain selected domains, to selectively undergo selected changes by process of two-photon absorption.

The great abundance of "selections" within the preceding paragraph accord a flexibility and a discrimination in exactly what is being done, and a definition of exactly where it is so being done, within the three-dimensional volume of active medium. Simplistically, those domains of a three-dimensional volume of active medium that are desired to be changed will be so changed, as desired, and will remain changed until changed again, if and when desired, while all domains not specifically selected will remain unchanged. This concept is basic to all memories. The implementation of the concept within a radiation volume will be seen to require a good deal of selectivity in choosing, modulating, and directing radiation beams.

A flexibility and discrimination in the choice of wavelength of each of two radiation beams permits, for example, that a three-dimensional inhomogeneity pattern may be, at times, either selectively radiatively (i) emplaced within, (ii) interrogated from, or (iii) erased from a three-dimensional volume—in-situ. The three-dimensional inhomogeneity pattern may constitute, for example, either (i) a physically tangible and persistent object, (ii) a transient display, or, preferably, (iii) a writable, readable, and erasable memory.

Such a memory, in particular, is characterized by a great multiplicity of selectively addressable and readable and writable domains, giving a high storage density on the order of $10^8$ bits/cm$^3$. The radiative reading and writing is very fast, giving an input/output data transfer bandwidth to and from the memory on the order of $10^{12}$–$10^{15}$ bits/second into each cm$^3$ of active medium. Many problems of scale, and parallelism, that attend previous memory technologies—such as limitations arising from necessary electrical interconnections, silicon real estate, and or heat—are substantially obviated in the three-dimensional optical memory technology of the present invention. Accordingly, the optical memory technology in accordance with the present invention is typically cheaper and faster than competing previous technologies while scaling upwards in performance, and down in cost, gracefully. For example, one preferred memory material is an optically active medium in a plastic matrix that typically costs on the order of some U.S. cents (1/100 $U.S.) per cm$^3$.

The apparatus, and method, of the present invention employs a three-dimensional volume of active medium. The medium selectively regionally undergoes selected changes in response to two-photon absorption arising from a correspondingly selected pair of spatially-intersecting temporally-coincident radiation beams.

The active medium may be, for example, a semiconductor, preferably an alkali halide crystal and more preferably indium phosphide. In this particular medium stable F-centers, being bound electrons at a negative ion vacancy, are produced by two light beams that jointly sum to an energy in the infrared (IR) range. The F-centers are erased by another two light beams that jointly sum to an energy in the visible range.

However, the preferred active medium is a photochromic material the radiatively undergoes changes in its isomeric molecular form. The preferred active medium is preferably a polymer, and is more preferably spirobenzopyran. The spirobenzopyran reversibly changes between its first, spiropyron, and its second, merocyanine, stable molecular isomeric forms in response to irradiation at an appropriate energy level. The spirobenzopyran medium is particularly induced to change from its first to its second isomeric molecular form by two selected coincident light beams (nominally of 532 nm and 1064 nm) that jointly sum to an ultraviolet (i.e., UV or "blue") energy level. The spirobenzopyran medium is induced to fluoresce in its second isomeric molecular form (only) by two selected coincident green-red light beams (nominally 1064 nm each) that jointly sum to a visible (i.e., "white") energy level. Finally, the spirobenzopyran medium is induced to erase back to its first isomeric molecular form by two selected coincident light beams that jointly sum to an infrared (i.e., IR or "red") energy level.

Such a "red, white, and blue" active medium, and its functional equivalents, is distinguished, from the perspective of the present invention, for being (i) transparent and unreactive, in each of its potentially several conditions, to any light beam or beams collectively having less than a threshold energy, (ii) substantially stable in those changed conditions that it selectively assumes under impingent light energy(ies) of an appropriate magnitude(s), and (iii) selectively fluorescent, under impingent light energy(ies) of an appropriate magnitude(s), dependent upon a prior condition of such medium. These three characteristics are, in combination, profound. They permit that a three-dimensional volume of active medium may be selectively radiatively both written and read, and that it is stable in the conditions assumed.

Moreover, the minimum theoretical amount, or a "domain," of such an active medium that may be independently manipulated is but a single molecule. However, because a single molecule is typically much smaller than the diffraction limited spot sizes of the radiation, normally light, that is used to selectively manipulate such a molecule, the volume of a domain is typically a few cubic microns. The granularity of a three-dimensional inhomogeneity pattern that is radiatively created within the active medium, or, equivalently, the information storage density of a volume memory that is made from the medium, is limited only by the ability to reliably bring separate, intersecting, beams of light into temporal and spatial coincidence within the minute domains of a volume of the medium. (It is not immediately apparent that the optical resolution, or discrimination, in radiatively "addressing" domains within a three-dimensional volume of active medium should constitute the limiting factor to the granularity of the manipulation of such a medium. For example, it might have been difficult to put enough radiative energy into the selected domains. In fact, a simultaneous delivery of sufficient radiative energy into even a large number (e.g., $10^6$) of selected domains constitutes, with high-power laser radiation sources, no insurmountable problem. In fact, it might have proven difficult to detect the minute flux of fluorescence that arises from a reading interrogation of a spatially minute domain. In fact, it is not difficult to so detect weak, and transient, light flashes resulting from fluorescence—at least when modern semiconductor light detectors are used. Accordingly, the challenge is to radiatively locate and address cubic micron size domains. The domains respond reliably to appropriate coincident radiation beams, and hold state reliably regardless of their minute volumes.)

In accordance with the present invention the selective manipulation, or "addressing," capability of a three-dimensional volume of active medium is quite good: a selected grid array of $10^3 \times 10^3$ domains may typically be "addressed" by intersecting light beams over a planar area of 1 cm×1 cm. Typically at least $10^2$ such planar bit arrays, or bit planes, may be "addressed" in each 1 cm$^3$ volume.

The selective radiative "addressing" of domains is only indirectly correlated with the numbers of such addressable domains that are to be simultaneously manipulated. In the present invention the manipulations of the domains is of the same scale as the addressing. The manipulation of the domains is massively parallel: an entire bit plane of $10^6$ domains may typically be simultaneously both addressed and manipulated.

Addressing access (setup) times are typically in the order of milliseconds, and repetitive radiative reading or writing times are typically in the order of microseconds. This rapid addressing, and selective radiation manipulation, is realized by completely solid state, and non-mechanical, light steering and modulating components.

The manner of selectively addressing domains, typically an entire bit plane of such $10^6$ such domains, within the three-dimensional volume of active medium is both conceptually and operationally distinguished from the manner in which the multiplicity ($10^6$) of domains that are simultaneously addressed are ultimately selectively radiatively manipulated. Selective addressing in accordance with the present invention is a matter of bringing two substantially orthogonal light beams into temporal and spatial coincidence at certain selected domains (the selected bit plane), and insubstantially into coincidence elsewhere (the unselected bit planes). Selective manipulation in accordance with the present invention is a matter of binary modulation of the radiative flux intensity of spatial regions upon a single wavefront of one of the two light beams.

In a rudimentary embodiment of the present invention the selective addressing is obtained by directing, preferably in and by a one-dimensional spatial light modulator that is electronically controlled, a first light beam so as to simultaneously illuminate all the domains within a selected bit plane. Meanwhile, the remaining, unselected, planes are insubstantially illuminated by this first light beam. At the same time a second, substantially orthogonal, light beam illuminates all the domains within all the parallel bit planes. (As will be further discussed below, it is this second light beam that is amplitude-encoded, and that is normally binary-amplitude-encoded, with information, normally binary information, that is to be placed (in the instance of writing) within the domains of the bit plane.) By this controlled direction of two light beams only those domains that are within the single selected bit plane have a potential to receive substantial coincident illumination from both the first and second light beams, and to undergo change by process of two-photon absorption.

The preferred embodiment of the optical memory in accordance with the present invention preferably does not direct the information-encoded (in a manner to be explained) second light beam directly and equally to all the parallel bit planes, including to the selected bit plane. Instead, the information-encoded second light beam is controllably directed to illuminate the selected bit plane more intensely than any remaining bit planes, although the remaining bit planes will still receive some illumination. The controllably directed illumination is obtained by dynamically selectively focusing the second beam onto the selected bit plane, preferably in and by use of a holographic dynamic focusing lens (HDFL).

The preferred HDFL consists of a phase-only spatial light modulator (SLM) and a multiplexed random phase encoded hologram.

The reasons for concentrating the second light beam onto the selected bit plane by focusing are several. An information encoding of the second light beam (as will be explained) normally transpires in parallel: an n×n, normally $10^3 \times 10^3$, grid array of regions being encoded within a single wavefront. This spatial encoding of information is preferably performed in a two dimensional spatial light modulator (SLM). Such a 2-D SLM is typically, for a $10^3 \times 10^3$ grid of encoding elements, on the order of 10 cm×10 cm in area. Accordingly, a spatially-encoded second beam having a conveniently macroscopic cross-sectional area on the order of 10 cm×10 cm is desirably reduced by focusing to a much smaller area, on the order of 1 cm×1 cm, comprising one bit plane within the volume of active medium. Simply put, the focusing permits relatively large SLMs to communicate with relatively small memory domains.

However, still further, sophisticated, advantages accrue from focusing. The cone of the focused light normally subtends a large solid angle. Accordingly, even those bit planes that are immediately adjacent the single selected bit plane are illuminated significantly less intensely by the focused second beam than is the single selected bit plane. If any stray light from the directed first beam falls outside the selected plane, such as because of reflections from impurities within the active medium and/or its supporting matrix, then such extraneous light, coupled with the reduced-intensity of second beam within these unselected regions, has proven to be incapable of changing the condition of any significant amount of the active medium—even after billions of "worse-case" cycles writing all bits on an adjacent bit plane.

Meanwhile, the domains of the selected bit plane are sharply and stably defined in their spatial extent, and in their spatial location, by the focusing. The spatially-encoded binary-encoded second beam that is focused onto the selected bit plane illuminates those domains within the bit plane which are intended to be manipulated by process of two-photon absorption exceedingly intensely, changing these domains quickly and resolutely. Those domains within the selected bit plane which correspond to spatial regions of the binary-encoded second beam that are dark, and absent of significant light, will not incur any significant change by process of two-photon absorption. This is the case regardless that the second beam is focused, or intensified. This holds true because any extraneous second-beam light that might otherwise reach these unchanging domains is generally off-axis from the second beam, and is not intensified at the bit plane by the focusing.

By benefit of focusing (of the second light beam, only), the preferred addressing in accordance with the present invention enjoys an excellent optical signal-to-noise. A good optical signal-to-noise is required more of an optical memory, which must be stable in its storage of data and reliable in all manners of repetitive references thereto across a span of years, than of optical logic elements which must typically perform only from one logic cycle to the next. The excellent optical signal-to-noise of a three-dimensional optical memory in accordance with the present invention is also promoted by the preferred manner of spatially encoding that beam (the second beam) which is used to selectively manipulate the domains of an addressed bit plane. This preferred spatial encoding is described next.

In accordance with the present invention, a spatial encoding of the regions upon a single wavefront of a light beam that is used, in conjunction with another beam, to selectively manipulate a volume of active medium by process of two-photon absorption is realized by (i) a polarizer, (ii) a polarizing beam splitter, and (iii) a two-dimensional polarizing spatial light modulator. The ultimately desired spatial modulation is binary. Each of the spatial regions of an n×n grid array will desirably contain either (i) full intensity light flux or (ii) no light flux at all.

Such on-off binary amplitude modulation can be roughly obtained, among other alternatives, by a spatial light modulator (SLM) of the amplitude-modulating type that directly modulates amplitude, or intensity. However, spatial modulation in the present invention is preferably derived by use of an SLM of the polarization modulation type in conjunction with a Polarizing Beam Splitter (PBS) and Linear Polarizer (LP). In order to do so, a light beam is first linearly polarized by the LP, and is then reflected by the PBS onto an n×n grid array of a 2-D phase-modulating SLM. Each of n×n regions within a wavefront of the linearly polarized light beam is selectively modulated by the phase-modulating SLM to either (i) retain its linear polarization, or (ii) assume an elliptical polarization. The modulation of each separate region is dependent upon an electrical pre-initialization of the SLM. When the light beam is monochromatic polarized laser light, and when the SLM is tuned to the frequency of such light, the purity of polarization modulation in the output beam is excellent. All regions of the output beam are essentially either linearly or elliptically polarized. Upon reflection of the spatially polarization-modulated beam by the SLM back to the PBS, only the linearly polarized parts of the spatially polarization modulated light beam are allowed to pass directly through the PBS. The binary spatial polarization modulation of the light beam is thusly transformed into a binary spatial amplitude modulation of the same beam. The resultant binary spatial encoding is of extremely high quality: essentially each region of an n×n grid array upon a single wavefront of the second light beam will contain either (i) full, or else (ii) no, light flux.

It should be appreciated that neither intersecting light beam in a three-dimensional optical memory operating by process of two-photon absorption needs to be focused so as to improve optical signal-to-noise. It should be appreciated that the same three-dimensional optical memory will certainly function if the quality of binary spatial encoding of an interrogatory radiation beam is not 100%, and some spurious light flux "leaks" through. Indeed, the unique efficacy of the phenomenon of two-photon absorption in supporting (i) addressing, and (ii) writing data to or reading data from, selected domains within a two-dimensional volume of active medium might have encouraged a somewhat natural sloppiness in the construction of an optical memory employing such a phenomenon. It might have been found inappropriate or unnecessary to worry about a little extraneous light flux here or there from one light beam or the other when such extraneous light flux is vacating the local area at $3 \times 10^8$ meters/second, and can only do harm if both temporally and spatially coincident with such light from the other light beam as is also extraneous. Moreover, any stray molecules within the three-dimensional volume of active medium that become inadvertently changed do not appreciably interfere with all necessary, and continuing, manipulations of the immensely greater number of molecules that are properly manipulated within each of the addressable domains. Moreover, the three-dimensional volume of active medium can be periodically purged in bulk, and in all its molecules, by high temperature and/or washing radiation, as and when required.

The reasons why the three-dimensional optical memory in accordance with the present invention might be said to be concerned with "quality," as well as with speed and density, are several. First, when the digital informational contents of such memories are used in non-arithmetic processes such as correlation, any deterioration of data integrity, howsoever minute, will likely go undetected, and will cause only a long term systemic degradation in the performance of any system, such as a system for machine vision, within which the optical memory is used. Second, the potential for problems with data integrity are of a different order for 1 $cm^2$ of active medium containing $10^8$ bits than for 1 $m^2$ of active medium containing $10^{14}$ bits. A big optical memory, or one that must hold its information inviolate for long periods of both use and non-use, will be recognized to benefit by the general principles of the present invention regarding quality selectivity. This will hold true even if the principles of the present invention are expressed in optical memories having different, but functionally equivalent, construction to the preferred embodiment of a three-dimensional optical memory that is taught within this specification.

6. Conclusion

The 2-P 3-D OM in accordance with the present invention stores information in a 3-D volume while permitting parallel access to an entire bit plane of information, thus increasing the memory bandwidth by orders of magnitude over present two-dimensional memory devices. In addition, because the data is stored in a volume, very high data storage capacities can be achieved within a very small and inexpensive amount of active medium. The fast access time, and the low cost per megabyte, potentially makes the 2-P 3-D OM a competitor to magnetic and/or optical disks for mass storage applications. Such a 2-P 3-D OMD (H-A) may well be a critical component to the success of future parallel supercomputers, particularly those that are based on optoelectronic and 3-D VLSI technologies.

Accordingly, the scope of the present invention should be determined by the following claims only, and not solely in terms of that preferred embodiment within which the invention has been taught.

What is claimed is:

1. A method method of addressably altering a plurality of locations within a volume of active medium that has a plurality of locations upon each of a plurality of planes by selectively directing radiation energy to selectively-addressed locations in an amount sufficient so as to alter said locations while not altering remaining, unaddressed, locations, the method comprising:
   producing beams of radiation upon a first, and upon a second, path;
   regionally gating in a spatial light modulator the first-path beam of radiation so as to relatively more intensely illuminate a selected one plane of the volume of active medium than any remaining, unselected, planes of the volume are illuminated;

spatially encoding a plurality of regions on a wavefront of the second-path beam of radiation with, and responsively to, data;

selectively focusing the spatially-encoded data-encoded second-path beam onto the selected one plane of the volume so as to relatively more intensely illuminate this one plane than any remaining, unselected, planes of the volume are illuminated;

the simultaneous illumination of the selected one plane producing a spatial and a temporal coincidence of the first-path beam and the encoded second-path beam at this selected one plane being sufficient to alter a form of a plurality of locations at and on the selected one plane in accordance with the spatial encoding of the corresponding plurality of regions of the spatially-encoded data-encoded second-path beam;

the altering of form occurring by process of two-photon absorption that induces a fluorescence of each individual one of the plurality of locations that was previously in a first form while, simultaneously, causing that each individual one of the plurality of locations that was not previously in the first form will not be induced to fluorescence;

wherein any remaining locations upon the selected one plane, locations other than that plurality of locations that receive illumination from the spatially-encoded data-encoded second-path beam, are substantially unaltered in form;

wherein all remaining locations within the entire volume of active medium that are not within the selected one plane receive insufficiently energetic illumination from the first-path beam, from the second-path beam, or from any spatial and temporal coincidence of both the first-path and second-path beams, so as to be altered in form; and detecting the fluorescence of the individual ones of the plurality of locations as an indication that each individual one of the plurality of locations either was, or was not, previously within the first form;

therein reading the form of the individual ones of the plurality of locations.

2. A radiation volume memory comprising:

a three-dimensional volume of active medium responsive in each of a multiplicity of three-dimensionally arrayed regions thereof to a first set of two or more temporally and spatially coincident radiation beams which are jointly possessed of a first energy in order to change from a first form to a second form by process of plural photon absorption, and also responsive in each of the multiplicity of three-dimensionally arrayed regions to a second set of two or more temporally and spatially coincident beams of directed radiation which are jointly possessed of a second energy, different than the first energy, to fluoresce in each such region as is within its second form by process of plural photon absorption;

means for impressing at a first, write, time a single temporal wavefront of a first beam of a first set of two beams of directed radiation with a plurality of binary bits of information, this first-set first beam thus carrying a plurality of binary bits of information at the same time and in parallel;

means for focusing at the first, write, time the information-impressed first-set first beam of directed radiation so that the single wavefront bearing in parallel the plurality of binary bits of information is focused upon a like plurality of regions in a single plane of the three-dimensional volume of active media, the beam being substantially unfocused in other planes of the three-dimensional volume of active media; and means for illuminating at the first, write, time with a second beam of the first set of two beams of directed radiation the single plane, in all regions thereof, selectively and to the substantially exclusion of any illuminating of other planes parallel to the single plane;

wherein coincidence at the first, write, time of the information impressed focused first beam and the second beam of the first set of two beams of radiation in the single plane is sufficient to change the form of such ones of the plurality of regions in the single plane as are in their first form to their second form in accordance with the plurality of binary bits, the binary information thus being written in parallel to the volume of active medium by radiation;

means for impressing at a second, read, time a single temporal wavefront of a first beam of a second set of two beams of directed radiation with a pattern of binary bits corresponding to the locations of regions upon the single plane that are to be read, this second-set first beam thus carrying at the same time and in parallel a mask of the locations upon the single plane that are to be read;

means for focusing at the second, read, time the mask-impressed second-set first beam of directed radiation so that the single wavefront bearing in parallel the pattern of binary bits is focused upon a like plurality of regions in the single plane of the three-dimensional volume of active media, the beam being substantially unfocused in other planes of the three-dimensional volume of active media; and means for illuminating at the second, read, time with a second beam of the second set of two beams of directed radiation the single plane, in all regions thereof, selectively and to the substantial exclusion of any illuminating of other planes parallel to the single plane;

wherein coincidence at the second, read, time of the information impressed focused first beam and the second beam of the second set of two beams of radiation in selected regions of the single plane is sufficient to cause those of such selected regions as are in their second form to fluoresce, the binary information that is within these selected regions thus being optically read in parallel from the volume of active medium by radiation.

3. A system responsive to a plurality of bits of binary information for producing at one time a corresponding plurality of inhomogeneous regions within a three-dimensional volume of active medium having a multiplicity of regions by use of directed radiation, the system comprising:

a three-dimensional volume of active medium having a multiplicity of regions that are individually responsive to radiation of a first energy level to change from a first form to a second form, and that are substantially transparent and substantially non-responsive to the radiation of the first energy level if within their second form, and that are individually responsive to radiation of a second energy level to fluoresce if within their second form, and that are substantially transparent and substantially non-responsive to the radiation of the second energy to do anything appreciable, including fluorescing, if within their first form;

radiation source means for producing beams of radiation on a first, and upon a second, path which first-path and second-path beams are each individually less than either the first or the second energy but which first-path and second-path beams, at times, jointly sum to the first energy level and, at other separate times, jointly sum to the second energy level;

first directing means for directing the first-path beam to simultaneously first-radiate at least a plurality of regions within the three-dimensional volume of active medium, the first-radiation alone being individually insufficient to either change the form of any of the multiplicity of regions within the three-dimensional volume of active medium or to cause any of the multiplicity of active regions to fluoresce;

beam spatial gating means responsive to the plurality of bits of binary data for selectively gating the second-path beam in a corresponding plurality of the locations thereof that are simultaneously upon a single wavefront, the selective gating serving to encode the second-path beam's wavefront with the information;

selective second-beam directing means for directing the second-path beam's wavefront into the three-dimensional volume of active medium selectively so that the plurality of encoded locations of the second-path beam's wavefront are radiatively directed onto the plurality of regions of the three-dimensional volume of active medium, second-radiating these regions temporally and spatially simultaneously that they are first-radiated by the first directing means so that, upon such times as the first-path and the second-path beams jointly sum to the first energy (i) regions of the volume of active medium corresponding to the binary information receive from both the first-path radiation and the second-path radiation jointly the first energy and, when within their first form, change from their first form to their second form responsively thereto, (ii) meanwhile that these regions corresponding to the binary information that are within their second form are unchanged, and (iii) meanwhile that remaining regions not corresponding to the binary information fail to receive from both the first-path radiation and the second-path radiation the first energy, and are thus unchanged in form whether within the first or within the second form;

so that, upon such times as the first-path and the second-path beams jointly sum to the second energy, (i) regions of the volume of active medium corresponding to the binary information receive from both the first-path radiation and the second-path radiation jointly the second energy and, when within their second form, fluoresce responsively thereto, (ii) meanwhile that these regions corresponding to the binary information that are within their first form neither fluoresce nor change, and (iii) meanwhile that remaining regions not corresponding to the binary information fail to receive from both the first-path radiation and the second-path radiation the second energy, and thus neither fluoresce nor change in form.

4. A system for radiatively reading and writing a volume of active medium, the system comprising:

a three-dimensional volume of active medium that is possessed of, and at least momentarily persists in, each of two, a first and a second, forms
wherein the first form is sensitive to radiation of a first energy to undergo a first photoconversion so as to change to the second form, but which first form exhibits substantial insensitivity to radiation of a different, second, energy, and
wherein the second form is sensitive to radiation of the second energy to undergo a second photoconversion;

a first radiation source for producing at a writing time a first and a second beam of radiation, which beams jointly are of a combined energy equal to the first energy, but which beams individually are each of an energy that is both less than the first energy and unequal to the second energy;

first beam-directing means for directing at the writing time the first beam of radiation to illuminate a writing-time first portion, less than the entirety, of the three-dimensional volume of active medium so as to cause this writing-time first portion to assume a virtual state;

second beam-directing means for directing at the writing time the second beam of radiation to illuminate the three-dimensional volume of active medium in order to intersect therein the first beam of radiation within a writing-time intersection volume that includes at least a second portion of the first portion;

wherein parts of the writing-time intersection volume that existed in the first form, and that have assumed a virtual state responsive to the first beam of radiation, are photoconverted, by temporal and spatial coincidence of the second beam of radiation, to the second form by a process of two-photon absorption;

wherein parts of the writing-time intersection volume that existed in the second form are substantially unchanged;

wherein all portions of the three-dimensional volume of active medium that are not within the writing-time intersection volume are substantially unchanged;

a source of third and a fourth beam of radiation, which beams are, at the reading time separate from the writing time, jointly of a combined energy equal to the second energy, but which beams individually are each of an energy less than the second energy;

a second radiation source for producing, at a reading time separate from the writing time, radiation having an energy equal to the second energy, the second radiation source including
a source of third and a fourth beam of radiation, which beams are, at the reading time separate from the writing time, jointly of a combined energy equal to the second energy, but which beams individually are each of an energy less than the second energy;

directing means for directing the radiation having an energy equal to the second energy onto the three-dimensional volume of active medium in order to illuminate reading-time intersection volume, less than the entirety of the volume, therein causing within this reading-time intersection volume a second photoconversion by such of the medium of the second form as is present therein, the directing means including third beam-directing means for directing at the reading time the third beam of radiation to illuminate a reading-time first portion, less than the entirety, of the three-dimensional volume of active medium so as to cause this reading-time first portion to assume a virtual state; and fourth beam-directing means for directing at the reading time the fourth beam of radiation to illuminate the three-dimensional volume of active medium in order to intersect therein the directed third beam of radiation within a reading-time intersection volume that includes at least a second portion of the reading-time first portion;

wherein parts of the reading-time intersection volume that are in the second form undergo photoconversion by process of two-photon absorption in response to joint illumination by the third and the fourth beam of the detector;

wherein the parts of the reading-time intersection volume that undergo photoconversion are detected by the detection;

wherein parts of the reading-time intersection volume that exists in the first form are substantially unchanged;

wherein all portions of the three-dimensional volume of active medium that are not within the reading-time intersection volume are substantially unchanged; and a detector of the second photoconversion occurring within the reading-time intersection volume of active medium;

wherein the memory system is stimulated for detection, in and by the detector, of information that is contained within the volume of active medium by radiation.

5. A system for radiatively reading and writing a volume of active medium, the system comprising:

a three-dimensional volume of active medium that is possessed of, and at least momentarily persists in, each of two, a first and a second, forms wherein the first form is sensitive to radiation of a first energy to undergo a first photoconversion so as to change to the second form, but which first form exhibits substantial insensitivity to radiation of a different, second, energy, and wherein the second form of the three-dimensional volume of active medium is sensitive to radiation of a second energy so as to undergo a second photoconversion where fluorescent light is emitted;

a first radiation source for producing at a writing time a first and a second beam of radiation, which beams jointly are of a combined energy equal to the first energy, but which beams individually are each of an energy that is both less than the first energy and unequal to the second energy;

first beam-directing means for directing at the writing time the first beam of radiation to illuminate a writing-time first portion, less than the entirety, of the three-dimensional volume of active medium so as to cause this writing-time first portion to assume a virtual state;

second beam-directing means for directing at the writing time the second beam of radiation to illuminate the three-dimensional volume of active medium in order to intersect therein the first beam of radiation within a writing-time intersection volume that includes at least a second portion of the first portion;

wherein parts of the writing-time intersection volume that existed in the first form, and that have assumed a virtual state responsive to the first beam of radiation, are photoconverted, by temporal and spatial coincidence of the second beam of radiation, to the second form by a process of two-photon absorption;

wherein parts of the writing-time intersection volume that existed in the second form are substantially unchanged;

wherein all portions of the three-dimensional volume of active medium that are not within the writing-time intersection volume are substantially unchanged.

a source of third and a fourth beam of radiation, which beams are, at the reading time separate from the writing time, jointly of a combined energy equal to the second energy, but which beams individually are each of an energy less than the second energy;

a second radiation source for producing, at a reading time separate from the writing time, radiation having an energy equal to the second energy;

directing means for directing the radiation having an energy equal to the second energy onto the three-dimensional volume of active medium in order to illuminate reading-time intersection volume, less than the entirety of the volume, therein causing within this reading-time intersection volume a second photoconversion by such of the medium of the second form as is present therein; and a detector of the second photoconversion occurring within the reading-time intersection volume of active medium, the detector including a detector of fluorescent light;

wherein the memory system is not only stimulated by radiation for a detection, in and by the detector, of information that is contained within the volume of active medium, but this detection, in and by the detector, is itself of radiation, namely fluorescent light;

wherein the memory system is read as well as written by radiation.

6. A system for radiatively writing a volume of active medium, the system comprising:

a three-dimensional volume of active medium that is possessed of, and at least momentarily persists in, each of two, a first and a second, forms wherein the first form is sensitive to radiation of a first energy to undergo a first photoconversion so as to change to the second form, but which first form exhibits substantial insensitivity to radiation of a different, second, energy;

wherein the second form is sensitive to radiation of the second energy to undergo a second photoconversion;

wherein the second form of the three-dimensional volume of active medium is substantially insensitive to radiation of the first energy;

a first radiation source for producing at a writing time a first and a second beam of radiation, which beams jointly are of a combined energy equal to the first energy, but which beams individually are each of an energy that is both less than the first energy and unequal to the second energy;

first beam-directing means for directing at the writing time the first beam of radiation to illuminate a writing-time first portion, less than the entirety, of the three-dimensional volume of active medium so as to cause this writing-time first portion to assume a virtual state;

second beam-directing means for directing at the writing time the second beam of radiation to illuminate the three-dimensional volume of active medium in order to intersect therein the first beam of radiation within a writing-time intersection volume that includes at least a second portion of the first portion;

wherein parts of the writing-time intersection volume that existed in the first form, and that have assumed a virtual state responsive to the first beam of radiation, are photoconverted, by temporal and spatial coincidence of the second beam of radiation, to the second form by a process of two-photon absorption;

wherein parts of the writing-time intersection volume that existed in the second form are substantially unchanged;

wherein all portions of the three-dimensional volume of active medium that are not within the writing-time intersection volume are substantially unchanged.

7. A volume memory stimulated for a reading of the information contents thereof by radiation, the memory comprising:

a three-dimensional volume of active medium that is possessed of, and at least momentarily persists in, each of two, a first and a second, forms
wherein the first form is sensitive to radiation of a first energy to undergo a first photoconversion so as to change to the second form, but which first form exhibits substantial insensitivity to radiation of a different, second, energy, and
wherein the second form of the three-dimensional volume of active medium is sensitive to radiation of the second energy to undergo a second photoconversion causing the emission of fluorescent light;

a radiation source of a first and a second beam of radiation, which beams are, at a reading time, jointly of a combined energy equal to the second energy, but which beams are individually each of an energy less than the second energy;

first beam-directing means for directing at the reading time the first beam of radiation to illuminate a reading-time first portion, less than the entirety, of the three-dimensional volume of active medium so as to cause this reading-time first portion to assume a virtual state;

second beam-directing means for directing at the reading time the second beam of radiation to illuminate the three-dimensional volume of active medium in order to intersect therein the first beam of radiation within a reading-time intersection volume that includes at least a second portion of the first portion; and a detector of the second photoconversion occurring anywhere within the three-dimensional volume of active medium including the reading-time intersection volume of active medium, the detector including
a detector of fluorescent light;

wherein parts of the reading-time intersection volume that exist in the second form undergo photoconversions by process of two-photon absorption in response to joint illumination by the first and the second beam of radiation;

wherein those parts of the reading-time intersection volume that undergo photoconversions are detected by the detector;

wherein those parts of the reading-time intersection volume undergoing photoconversions that are detected by the detector serve to convey information that was stored within the volume of active medium;

wherein parts of the reading-time intersection volume that exist in the first form are substantially unchanged;

wherein all portions of the three-dimensional volume of active medium that are not within the reading-time intersection volume are substantially unchanged;

wherein the memory system is not only stimulated by radiation for detection, in and by the detector, of information that is contained within the volume of active medium, but this detection, in and by the detector, is itself by radiation; and wherein the memory system is read as well as written by radiation.

8. The volume memory according to claim 7 further comprising:

a source of third and a fourth beam of radiation, which beams are, at a writing time separate from the reading time, jointly of a combined energy equal to the first energy, but which beams are individually less than the first energy; and wherein the first beam-directing means serves also at the writing time to direct the third beam of radiation to illuminate a writing-time first portion, less than the entirety, of the three-dimensional volume of active medium so as to cause this writing-time first portion to assume a virtual state;

wherein the second beam-directing means serves also at the writing time to direct the fourth beam of radiation to illuminate the three-dimensional volume of active medium in order to intersect therein the third beam of radiation within a writing-time intersection volume that includes at least a second portion of the first portion;

wherein parts of the writing-time intersection volume that exist in the first form are photoconverted to the second form by process of two-photon absorption in response to joint illumination by the third and the fourth beam of radiation;

wherein parts of the writing-time intersection volume that exist in the second form are substantially unchanged;

wherein all portions of the three-dimensional volume of active medium that are not within the writing-time intersection volume are substantially unchanged.

9. The volume memory according to claim 7
wherein the second form of the three-dimensional volume of active medium is substantially insensitive to radiation of the first energy.

* * * * *

UNITED STATES PATENT AND TRADEMARK OFFICE
CERTIFICATE OF CORRECTION

PATENT NO. : 5,325,324　　　　　　　　　　　　　　　　　　　　　　　　Page 1 of 1
DATED       : June 28, 1994
INVENTOR(S) : Peter M. Rentzepis et al.

It is certified that error appears in the above-identified patent and that said Letters Patent is hereby corrected as shown below:

<u>Column 1,</u>
Line 2, add as a new section before the REFERENCE TO RELATED PATENT APPLICATIONS:

-- RIGHTS IN THE U.S. GOVERNMENT

The present invention was developed under grant No. F30602-97-C-0014 between the United States Air Force (USAF) acting through its Office of Special Research (AFOSR) and The Regents of the University of California. The U.S. Government has a paid-up license in this invention and the right in limited circumstances to require the patent owner to license others on reasonable terms as provided for by the terms of the above-stated contract awarded by AFOSR. --.

Signed and Sealed this

Eighteenth Day of February, 2003

JAMES E. ROGAN
*Director of the United States Patent and Trademark Office*